US010989602B2

(12) United States Patent
Yung et al.

(10) Patent No.: US 10,989,602 B2
(45) Date of Patent: Apr. 27, 2021

(54) RECESSED CARBON NANOTUBE ARTICLE AND METHOD FOR MAKING SAME

(71) Applicant: Government of the United States of America, as represented by the Secretary of Commerce, Gaithersburg, MD (US)

(72) Inventors: Christopher S. Yung, Louisville, CO (US); Nathan A. Tomlin, Boulder, CO (US); Daniel R. Schmidt, Boulder, CO (US)

(73) Assignee: GOVERNMENT OF THE UNITED STATES OF AMERICA, AS REPRESENTED BY THE SECRETARY OF COMMERCE, Gaithersburg, MD (US)

( * ) Notice: Subject to any disclaimer, the term of this patent is extended or adjusted under 35 U.S.C. 154(b) by 127 days.

(21) Appl. No.: 16/454,456

(22) Filed: Jun. 27, 2019

(65) Prior Publication Data

US 2020/0003622 A1    Jan. 2, 2020

Related U.S. Application Data

(60) Provisional application No. 62/692,958, filed on Jul. 2, 2018.

(51) Int. Cl.
*G01J 5/02* (2006.01)
*C23C 16/26* (2006.01)
(Continued)

(52) U.S. Cl.
CPC .......... *G01J 5/023* (2013.01); *C23C 14/083* (2013.01); *C23C 14/5806* (2013.01);
(Continued)

(58) Field of Classification Search
CPC ....................................................... G01J 5/023
See application file for complete search history.

(56) References Cited

U.S. PATENT DOCUMENTS

| 7,723,684 B1* | 5/2010 | Haddon ............... G01J 5/02 250/338.1 |
| 8,110,883 B2 | 2/2012 | Ward et al. |
| (Continued) | | |

FOREIGN PATENT DOCUMENTS

CN      205898308 U      1/2017

OTHER PUBLICATIONS

Fernandes, G.E., et al., "Carbon nanotube microbolometers on suspended silicon nitride via vertical fabrication procedure", Applied Physics Letters, 2014, 201115, 104.
(Continued)

*Primary Examiner* — Yara B Green
(74) *Attorney, Agent, or Firm* — Office of Chief Counsel for National Institute of Standards and Technology

(57) ABSTRACT

A recessed carbon nanotube article includes a base; a substrate disposed on the base; wells disposed in the substrate and bounded by the base and a substrate wall; and a carbon nanotube element disposed in individual wells and including vertically aligned carbon nanotubes such that a longitudinal length of the vertically aligned carbon nanotubes is less than a depth of the well in which the carbon nanotube element is disposed. A recessed carbon nanotube bolometer includes a base; a substrate on the base; radiation wells in the substrate; carbon nanotubes in the wells; thermistors and heaters on the membrane arranged as an electrical substitution member. A process for making a recessed carbon nanotube bolometer includes forming a substrate on a base; forming a radiation well in the substrate; forming
(Continued)

carbon nanotubes in the well; disposing a cover on the wells; and forming a thermistor and a heater on the base.

26 Claims, 17 Drawing Sheets

(51) Int. Cl.
    *C23C 14/58*     (2006.01)
    *G01J 5/22*     (2006.01)
    *G01J 5/20*     (2006.01)
    *C23C 14/08*     (2006.01)

(52) U.S. Cl.
    CPC ............... *C23C 16/26* (2013.01); *G01J 5/22* (2013.01); *G01J 2005/202* (2013.01)

(56) References Cited

U.S. PATENT DOCUMENTS

| | | |
|---|---|---|
| 8,455,828 B1 | 6/2013 | Egerton et al. |
| 9,212,950 B2 | 12/2015 | Xu et al. |
| 9,291,499 B2 | 3/2016 | Lehman et al. |
| 2008/0251723 A1* | 10/2008 | Ward .................. G01J 5/20 250/338.4 |
| 2013/0256627 A1* | 10/2013 | Jain .................... H01L 27/305 257/9 |
| 2019/0277702 A1* | 9/2019 | Aleman ................ G01J 5/20 |

OTHER PUBLICATIONS

Sood, A. K., et al., "Carbon nanotube based microbolometer development for IR imager and sensor applications", Proceedings of SPIE, 2011, 815513, 8155.

Tarasov, M., et al., "Carbon nanotube bolometers", Applied Physics Letters, 2007, 163503, 90.

He, X., et al., "Uncooled Carbon Nanotube Photodetectors", Advanced Optical Materials, 2015.

Sood, A.K., et al., "Nanostructured detector technologies for optical sensing applications", Proceedings of SPIE, 2014, 91000N, 9100.

Svatos, V., et al., "In situ observation of carbon nanotube layer growth on microbolometers with substrates at ambient temperature", Journal of Applied Physics, 2018, 114503, vol. 123.

Denoual, M., et al., "Smart functions for carbon nanotube bolometer", IEEE, 2015.

* cited by examiner

RECESSED CARBON NANOTUBE ARTICLE AND METHOD FOR MAKING SAME

CROSS REFERENCE TO RELATED APPLICATIONS

The application claims priority U.S. Provisional patent application Ser. No. 62/692,958 filed Jul. 2, 2018, the disclosure of which is incorporated herein by reference in its entirety.

STATEMENT REGARDING FEDERALLY SPONSORED RESEARCH

This invention was made with United States Government support from the National Institute of Standards and Technology (NIST), an agency of the United States Department of Commerce. The Government has certain rights in the invention. Licensing inquiries may be directed to the Technology Partnerships Office, NIST, Gaithersburg, Md., 20899; voice (301) 301-975-2573; email tpo@nist.gov; reference NIST Docket Number 18-026US1.

BRIEF DESCRIPTION

Disclosed is a recessed carbon nanotube article comprising: a base; a substrate disposed on the base; a plurality of wells disposed in the substrate and bounded by the base and a substrate wall; and a carbon nanotube element disposed in individual wells and that consists essentially of a plurality of vertically aligned carbon nanotubes such that a longitudinal length of the vertically aligned carbon nanotubes is less than a depth of the well in which the carbon nanotube element is disposed.

Disclosed is a process for making a recessed carbon nanotube article, the process comprising: forming a substrate on a base; forming a well in the substrate, the well being bound by the base and a substrate wall; forming vertically aligned carbon nanotubes in the well; terminating formation of vertically aligned carbon nanotubes in the well prior to a terminus of the vertically aligned carbon nanotubes penetrating beyond the well; and disposing a well cover on the substrate to cover the vertically aligned carbon nanotubes and the well in an absence of contact between the vertically aligned carbon nanotubes and the well cover.

Disclosed is a recessed carbon nanotube bolometer comprising: a base; a substrate disposed on the base; a plurality of wells disposed in the substrate and bounded by the base and a substrate wall; a radiation absorber disposed in individual wells and that: consists essentially of a plurality of vertically aligned carbon nanotubes such that a longitudinal length of vertically aligned carbon nanotubes is less than a depth of the well in which the radiation absorber is disposed; receives a stimulant radiation; and produces absorber heat from the stimulant radiation by the vertically aligned carbon nanotubes; a plurality of thermistors disposed on the base such that a first thermistor: is locally disposed and in thermal communication with a first radiation absorber in an absence of thermal communication with radiation absorbers that are adjacent to the first radiation absorber; receives the absorber heat from the vertically aligned carbon nanotubes; and produces a thermistor signal from the absorber heat; and a plurality of heaters disposed on the base such that a first heater: is locally disposed and in thermal communication with the first radiation absorber and disposed proximate to the first thermistor, in an absence of thermal communication with radiation absorbers that are adjacent to the first radiation absorber; receives electrical substitution current; produces, from the electrical substitution current, electrical substitution heat; and communicates the electrical substitution heat to the first thermistor that is proximately disposed to the first heater, wherein the thermistors and heaters are arranged as an electrical substitution member comprising an individual thermistor and an individual heater; and a readout member disposed on the base such that the heaters and the thermistors are interposed between the readout member and the base.

Disclosed is a process for making a recessed carbon nanotube bolometer, the process comprising: forming a substrate on a base; forming a well in the substrate, the well being bound by the base and a substrate wall; forming vertically aligned carbon nanotubes in the well; terminating formation of vertically aligned carbon nanotubes in the well prior to a terminus of the vertically aligned carbon nanotubes penetrating beyond the well; and disposing a well cover on the substrate to cover the vertically aligned carbon nanotubes and the well in an absence of contact between the vertically aligned carbon nanotubes and the well cover; forming a thermistor on the base opposite the well and the vertically aligned carbon nanotubes so that the thermistor is in thermal communication with the vertically aligned carbon nanotubes through the base; and forming a heater proximate to the thermistor and on the base opposite the well and the vertically aligned carbon nanotubes to make the recessed carbon nanotube bolometer so that the heater is in thermal communication with the vertically aligned carbon nanotubes through the base, wherein the thermistor and the heater are arranged as an electrical substitution member on the base.

BRIEF DESCRIPTION OF THE DRAWINGS

The following description should not be considered limiting in any way. With reference to the accompanying drawings, like elements are numbered alike.

DETAILED DESCRIPTION

A detailed description of one or more embodiments is presented herein by way of exemplification and not limitation.

A recessed carbon nanotube article and process for making the recessed carbon nanotube article herein overcomes a conventional limitation imparted by difficulty of integrating carbon nanotubes (CNTs) into a device due to high temperature growth of carbon nanotubes and subsequent difficulty in wafer scale post-processing when exposed, fragile CNTs are present. Advantageously, in the recessed carbon nanotube article, a carbon nanotube element includes vertically aligned carbon nanotubes (VACNTs) that are disposed in wells that can be micromachined into a substrate. A base at each well supports the carbon nanotube element. Beneficially, VACNTs are grown to a height less than a depth of the well, and a protective well cover can be disposed over an opening of the wells without contacting the VACNTs. The well cover provides protection to the recessed VACNTs from any mechanical contact, liquid exposure, plasma exposure, or gas exposure arising from subsequent processing steps. The well cover also provides physical protection, gas sealing, and optical filtering for a completed device.

It is contemplated that the VACNTs have a range of unique functionalities, including broadband absorption, field emission, functionalized sensing, heatsinking, and the like, in micromachined wells providing for post-processing after CNT deposition or growth so that high temperature growth of VACNTs do not deleteriously interfere with or damage subsequent processing steps or device layers.

Figure 1:
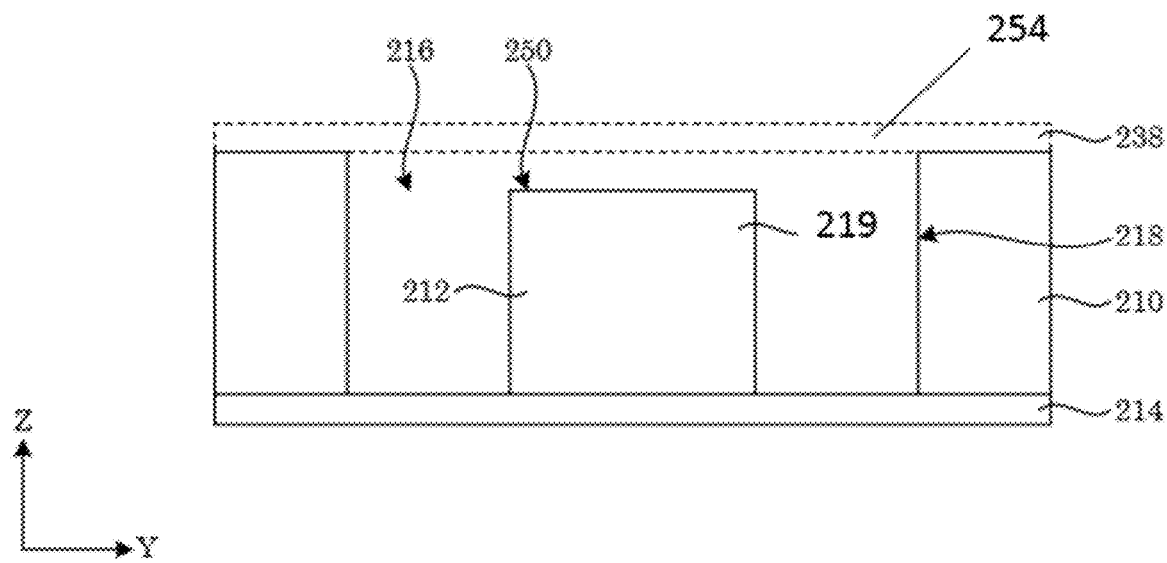
FIG. 1 shows a cross-section of a recessed carbon nanotube article.
Figure 2:
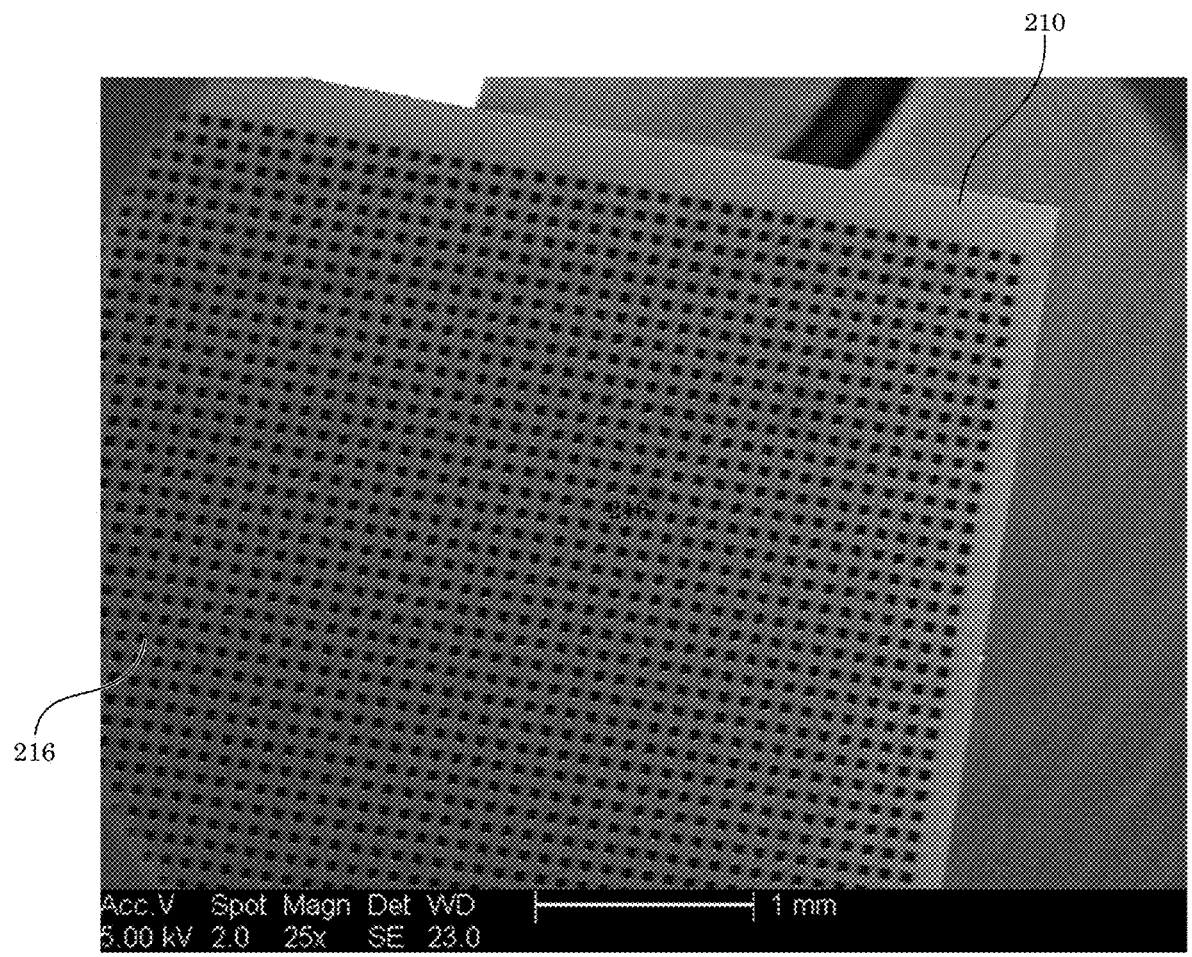
FIG. 2 shows a scanning electron microscope (SEM) image plan view of the recessed carbon nanotube article shown in FIG. 1, with an array of wells etched into a silicon substrate.
Figure 3:
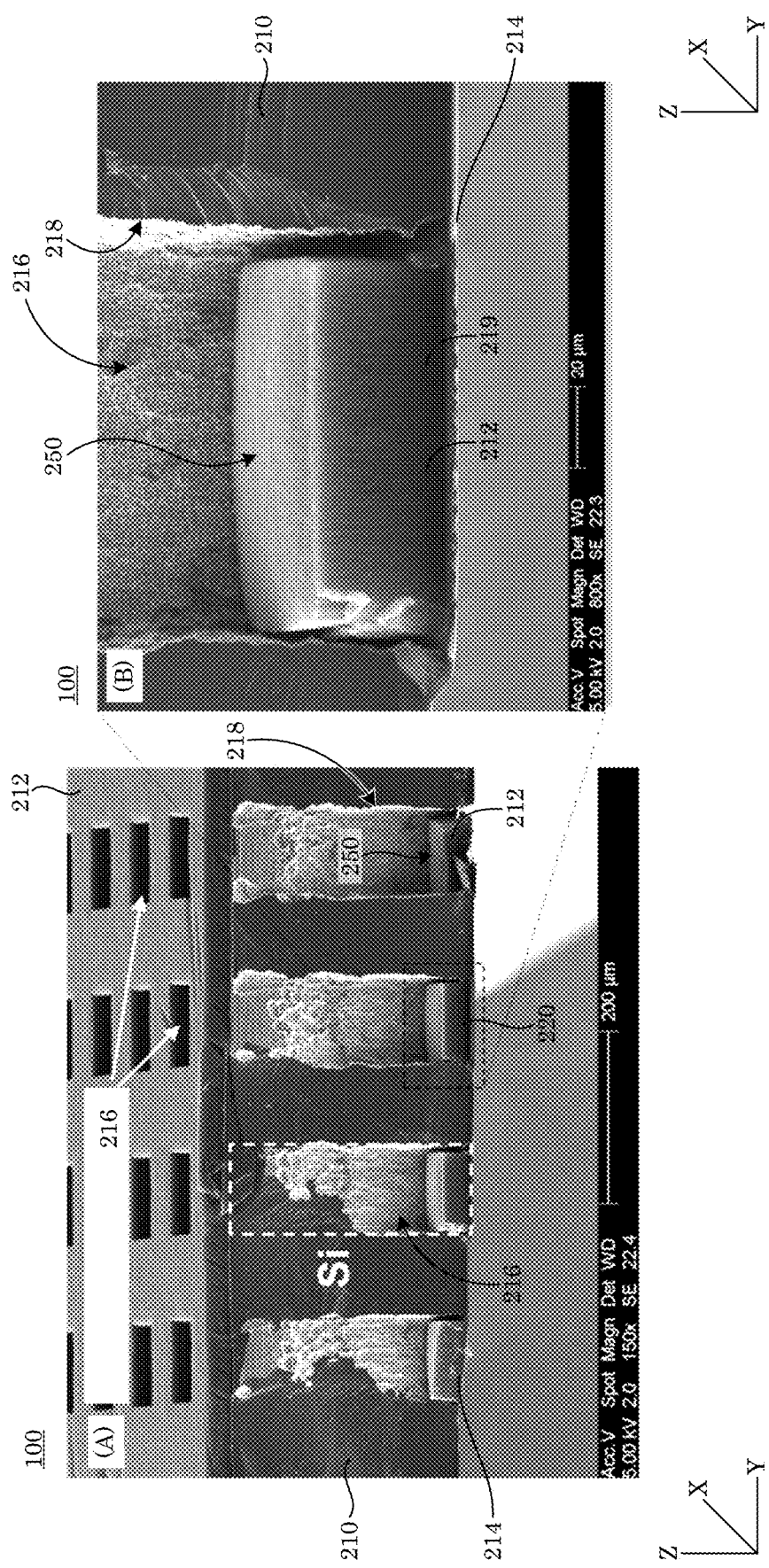
FIG. 3 shows an SEM image cut-away view in panel A. The recessed carbon nanotube article shown in FIG. 1 has been cleaved to show a cross-section of etched well with VACNTs at the base that is a silicon nitride membrane. Panel B shows an enlarged view of panel A.
Figure 4:
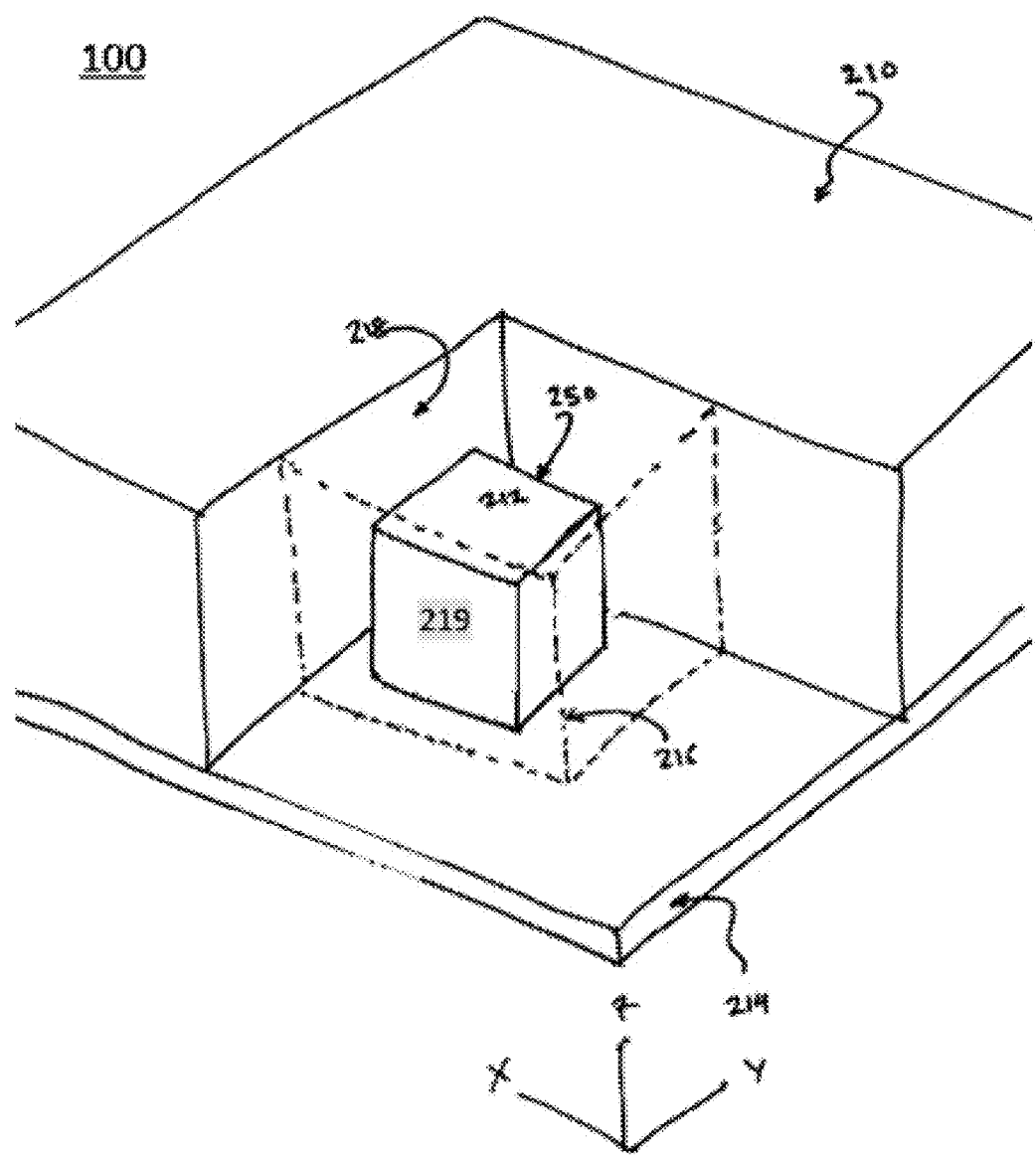
FIG. 4 shows a perspective view of the recessed carbon nanotube article shown in FIG. 1, wherein a substrate is shown and has been cut-out to reveal cross-sectional detail of VACNTs disposed on top of base in a well.

In an embodiment, with reference to FIG. 1, FIG. 2, FIG. 3, FIG. 4, FIG. 5, and FIG. 6, recessed carbon nanotube article 100 includes base 214; substrate 210 disposed on base 214; a plurality of wells 216 disposed in substrate 210 and bounded by base 214 and substrate wall 218; and carbon nanotube element 219 disposed in individual wells 216. Carbon nanotube element 219 includes, consist essentially of, or consist of a plurality of vertically aligned carbon nanotubes 212 such that a longitudinal length of vertically aligned carbon nanotubes 212 is less than a depth of well 216 in which carbon nanotube element 219 is disposed. Wells 216 having vertically aligned carbon nanotubes 212 disposed therein and are arranged in substrate 210 in an array as shown in FIG. 2.

Recessed carbon nanotube article 100 can include well cover 238 disposed on substrate 210 and opposing carbon nanotube element 219. Well cover 238, in combination with base 214 and substrate wall 218, bounds well 216 in absence of contact with vertically aligned carbon nanotubes 212.

In an embodiment, recessed carbon nanotube article 100 is configured as recessed carbon nanotube bolometer 200, which overcomes a conventional limitation imparted by difficulty of integrating carbon nanotubes into a bolometer caused by high temperature growth of carbon nanotubes and difficulty in wafer scale post-processing when present. Vertically aligned carbon nanotubes (VACNTs) 212 are desirable as bolometer absorbers due to their broadband absorption. When a recessed carbon nanotube article 100 is prepared as recessed carbon nanotube bolometer 200, a base of each well supports the VACNTs and is a weak thermal link. A temporary protective well cover can be disposed over an opening of the wells without contacting the VACNTs. The well cover allows subsequent processing in absence of exposed VACNTs. A permanent well cover can be disposed over an opening of the wells (without contacting the VACNTs) as a protective device layer (e.g., window) or for spectrally selective filtering of incoming absorber radiation. On an opposing side of the base, an array of thermistors and electrical substitution heaters, e.g., a single set per well, can be lithographically defined, e.g., by lift-off or etching, and a readout integrated circuit can be wire bonded or bump bonded to wiring of the thermistor and heater array.

VACNTs are broadband absorbers in micromachined wells that provide post-processing of recessed carbon nanotube bolometer 200 after VACNT deposition or growth so that high temperature growth of VACNTs do not deleteriously interfere with formation of the thermistor or heater. Additionally, recessed carbon nanotube bolometer 200 can be used with short-wave infrared (SWIR), mid-wave infrared (MWIR), long-wave infrared (LWIR), or far infrared and overcomes technical limitations of conventional microbolometers that are spectrally limited because of inclusion by use of a cavity formed by an absorber above a reflector, which is absent in recessed carbon nanotube bolometer 200. In addition, in recessed carbon nanotube bolometer 200, electrical substitution at a pixel-level, i.e., individual well, provides for internal calibration of recessed carbon nanotube bolometer 200 in an absence of an external black body calibration target to decrease system complexity.

Figure 8:
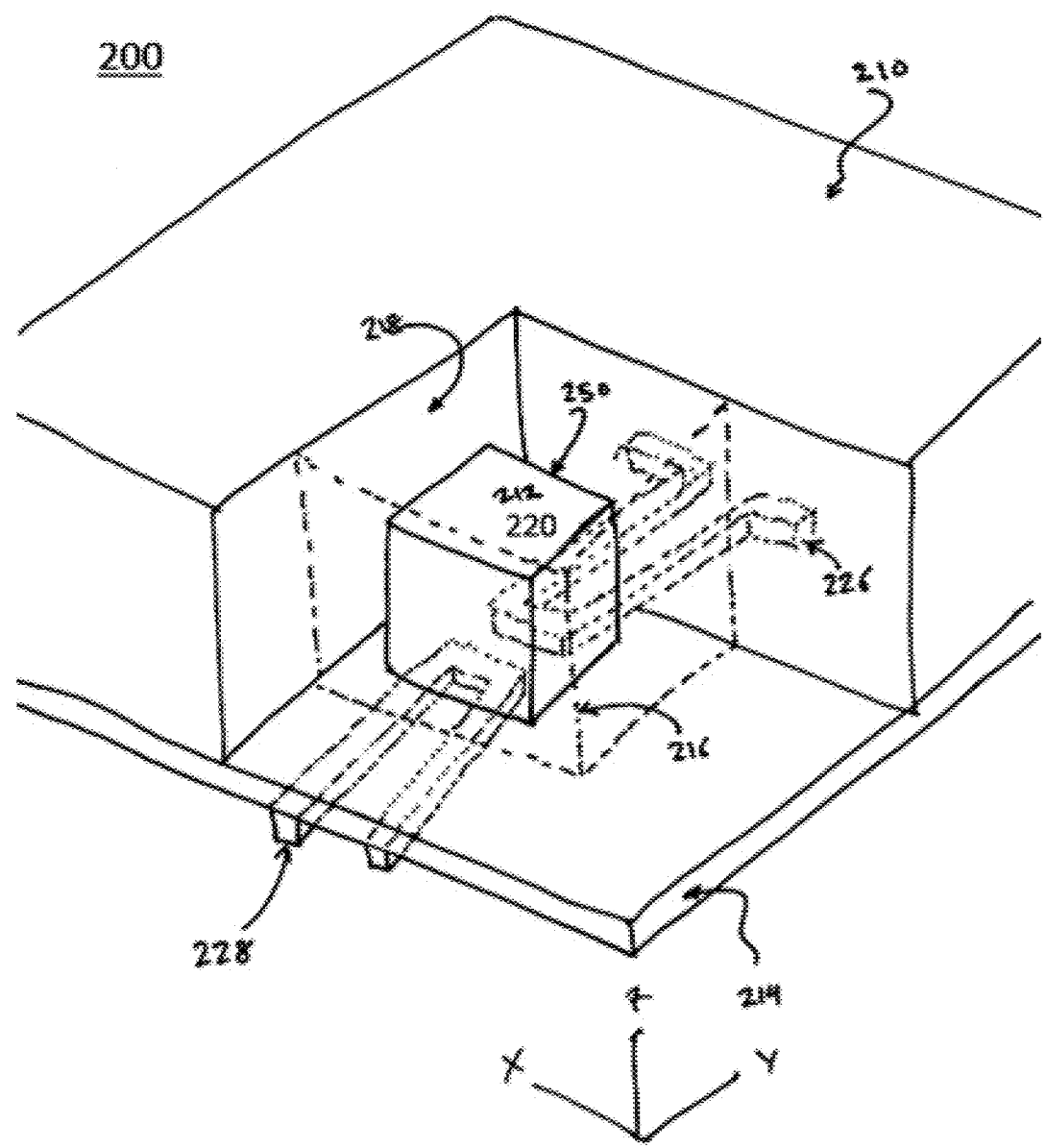
FIG. 8 shows a perspective view of the recessed carbon nanotube bolometer shown in FIG. 7, wherein a substrate is shown and has been cut-out to reveal cross-sectional detail, including relative arrangement of a radiation absorber, heater, and thermistor of an electrical substitution member.

Bolometry is performed with recessed carbon nanotube bolometer 200, wherein recessed carbon nanotube bolometer 200 receives radiation and provides a thermal response for determination of radiant energy. In an embodiment, with reference to FIG. 7, FIG. 8, FIG. 9, and FIG. 12, recessed carbon nanotube bolometer 200 includes recessed carbon nanotube article 100; and radiation absorber 220 that consists of a carbon nanotube element 219 that receives stimulant radiation 222 and produces absorber heat 230 from stimulant radiation 222 received by vertically aligned carbon nanotubes 212. Recessed carbon nanotube bolometer 200 also includes a plurality of thermistors 228 disposed on base 214, such that a first thermistor: is locally disposed and in thermal communication with a first radiation absorber 220 in an absence of thermal communication with radiation absorbers 220 that are adjacent to the first radiation absorber 220; receives absorber heat 230 from vertically aligned carbon nanotubes 212; and produces thermistor signal 248 from absorber heat 230. It should be appreciated that the other thermistors individually operate independently according to this manner. Recessed carbon nanotube bolometer 200 also includes a plurality of heaters 226 disposed on base 214 such that a first heater: is locally disposed and in thermal communication with first radiation absorber 220 and disposed proximate to the first thermistor, in an absence of thermal communication with radiation absorbers 220 that are adjacent to the first radiation absorber 220; receives electrical substitution current 234; produces, from electrical substitution current 234, electrical substitution heat 232; and communicates electrical substitution heat 232 to first thermistor 228 that is proximately disposed to first heater 226. It should be appreciated that the other heaters individually operate independently according to this manner. Moreover, the thermistors and heaters are arranged as electrical substitution member 236 including an individual thermistor 228 and an individual heater 226. Individual wells 216 with vertically aligned carbon nanotubes 212 and electrical substitution members 236 are referred to herein as a pixel. A mutual arrangement of vertically aligned carbon nanotubes 212 relative to heater 226 and thermistor 228 in a single pixel is shown in FIG. 8 with substrate 210 cut-out to reveal cross-sectional detail. An array of pixels as viewed from electrical substitution member 236 on base 214 is show in FIG. 9.

Recessed carbon nanotube bolometer 200 can include well cover 238 disposed on substrate 210 and opposing radiation absorber 220. Well cover 238, in combination with base 214 and substrate wall 218, bounds well 216 in absence of contact with vertically aligned carbon nanotubes 212

Figure 10:
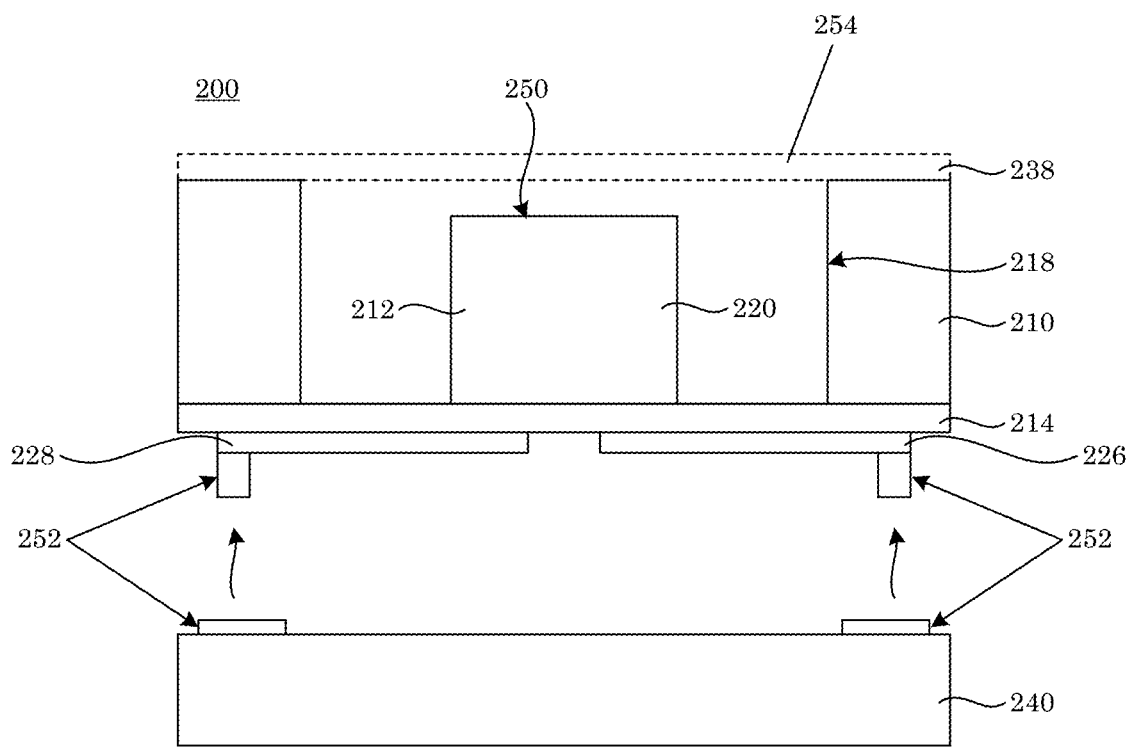
FIG. 10 shows a cross-section diagram of the recessed carbon nanotube bolometer shown in FIG. 7 and a readout 240, which is attached by bump bonds.
Figure 11:
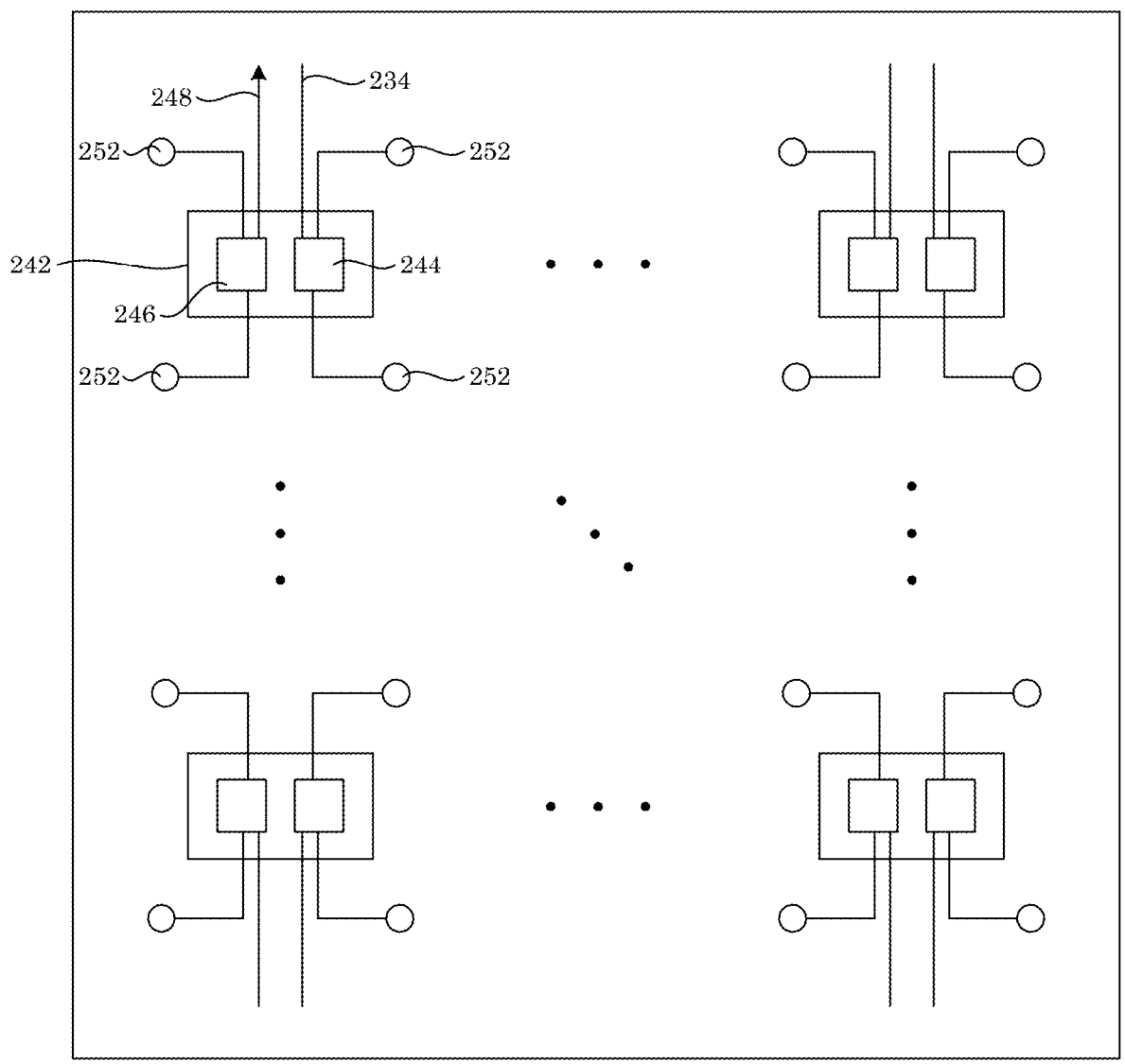
FIG. 11 shows a readout member that include a plurality of readout circuits with a thermistor circuit and a heater circuit.
Figure 12:
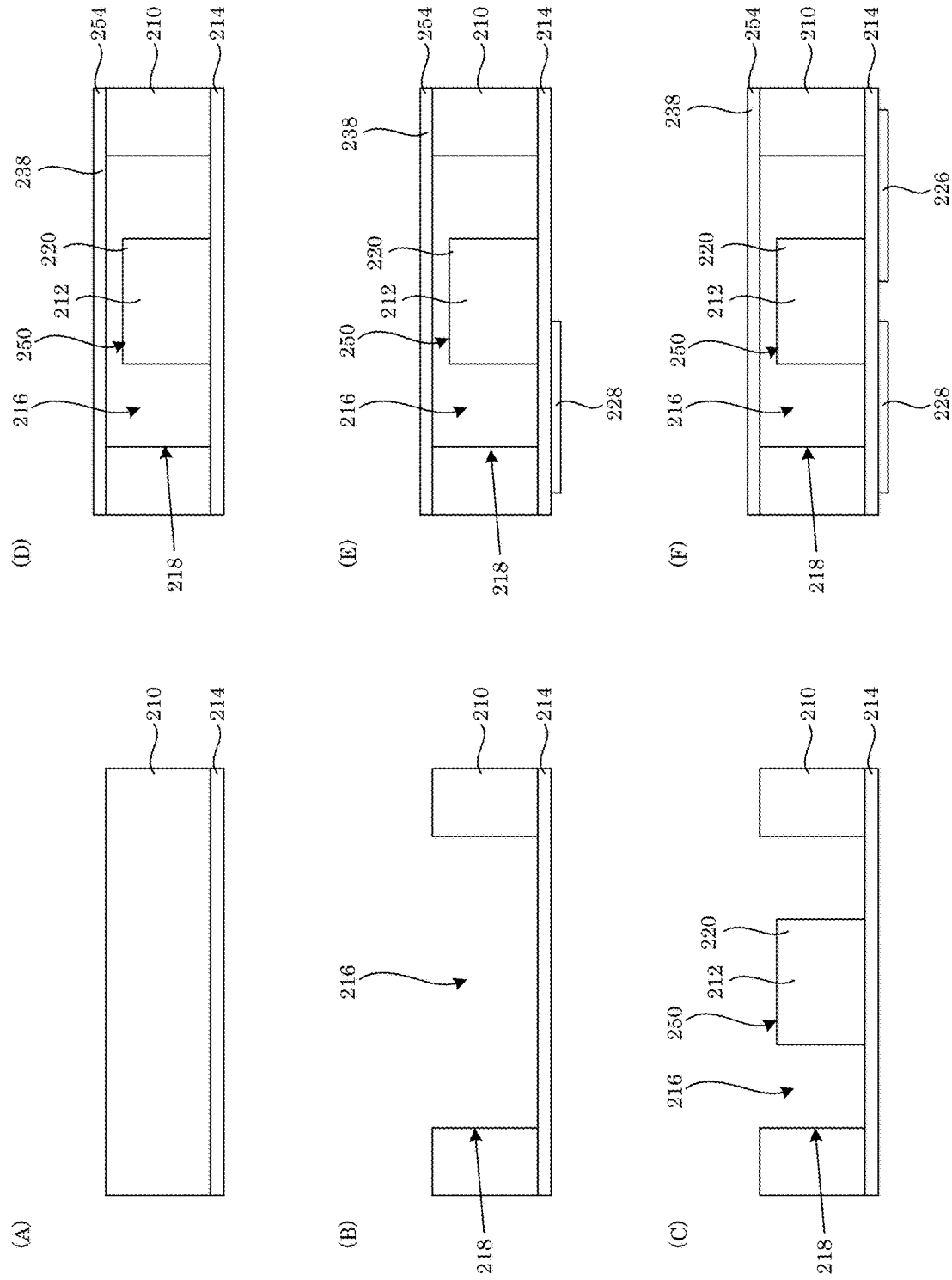
FIG. 12 shows cross-sections in a process for making a recessed carbon nanotube bolometer.
Figure 13:
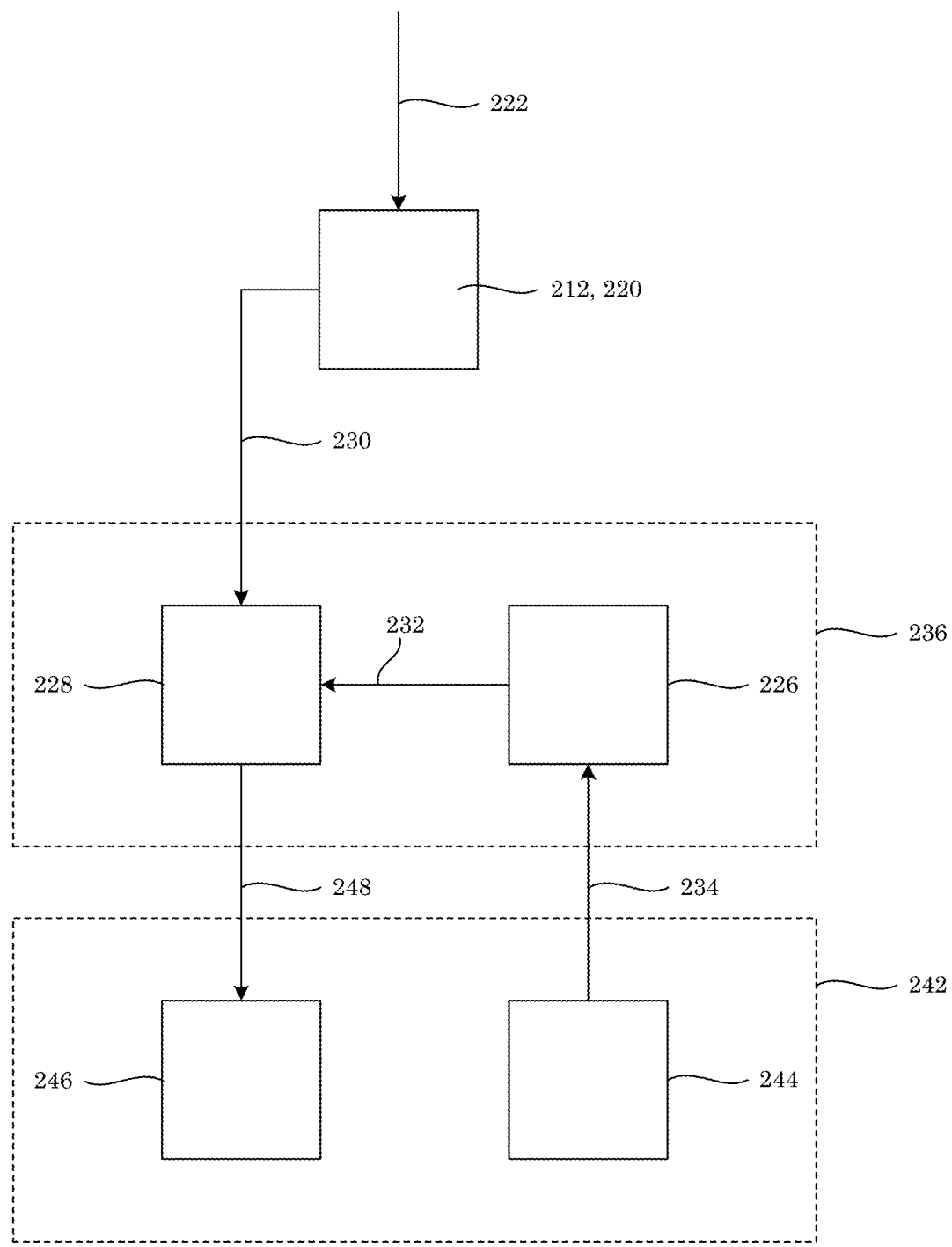
FIG. 13 shows electrical communication among elements of a recessed carbon nanotube bolometer.

In an embodiment, with reference to FIG. 10, FIG. 11, and FIG. 13, recessed carbon nanotube bolometer 200 includes readout member 240 disposed on base 214 such that heaters 226 and thermistors 228 are interposed between readout member 240 and base 214. Readout member 240 can include a plurality of readout circuits 242 such that an individual readout circuit 242 is locally disposed on and in electrical communication with an individual electrical substitution member 236. Here, each electrical substitution member 236 (including heater 226 and thermistor 228) is independently and individually electrically addressed by individual readout circuits 242. For each electrical substitution member 236, readout circuit 242 in electrical communication with electrical substitution member 236 includes heater circuit 244 in communication with heater 226 and thermistor circuit 246 in communication with thermistor 228. Heater circuit 244 provides electrical substitution current 234 to heater 226, and thermistor circuit 246 receives thermistor signal 248 from thermistor 228. Bump bond member 252 independently provides bonding and electrical conductivity between thermistor 228 and thermistor circuit 246 and also between heater 226 and heater circuit 244 to a readout member 240.

Base 214 can include a material that is compatible with carbon nanotube catalyst and growth such as silicon, silicon nitride, silicon oxide, fused silica, sapphire, germanium, diamond, and the like. Base 214 supports carbon nanotube element 219 and can be attached to substrate 210. Exemplary bases 214 include a low-pressure chemical vapor deposited (LPCVD) silicon nitride. Moreover, material for base 214 can be selected as appropriate for material parameters required in a particular embodiment. In an embodiment, silicon is base 214 to provide a relatively high thermal conductivity ($\approx 150$ W·m$^{-1}$·K$^{-1}$) while silicon nitride is base 214 for a relatively low thermal conductivity ($\approx 2$ W·m$^{-1}$·K$^{-1}$). A thickness of base 214 can be from 1 nm to 10 cm, specifically from 5 nm to 10 mm, and more specifically from 10 nm to 1 mm. A thermal conductivity of base 214 can be from 0.001 W·m$^{-1}$·K$^{-1}$ to 10,000 W·m$^{-1}$·K$^{-1}$, specifically from 0.01 W·m$^{-1}$·K$^{-1}$ to 1000 W·m$^{-1}$·K$^{-1}$, and more specifically from 0.1 W·m$^{-1}$·K$^{-1}$ to 200 W·m$^{-1}$·K$^{-1}$. In an embodiment, base 214 includes silicon. In an embodiment, base 214 includes silicon nitride with relatively low thermal conductivity compared to silicon as a weak thermal link for high sensitivity bolometry.

Substrate 210 can include silicon, silicon nitride, silicon oxide, fused silica, sapphire, germanium, and diamond to provide a structure in which to form wells 216 and dispose a carbon nanotube element 219. Exemplary substrates 210 include silicon. Moreover, base 214 is amenable to well formation by mechanical subtractive methods (e.g., milling, drilling, water jet, and the like), wet chemical etching (with, e.g., KOH, TMAH, and the like), reactive ion etching (with, e.g., XeF$_2$, SF$_6$, and the like), deep reactive ion etching (using, e.g., the Bosch process). A thickness of base 214 can be from 1 nm to 10 cm, specifically from 5 nm to 10 mm, and more specifically from 10 nm to 1 mm. In an embodiment, substrate 210 includes silicon.

Carbon nanotube element 219 can include grown or sprayed-on carbon nanotubes, single or multiwall carbon nanotubes, vertically aligned carbon nanotubes 212, black paint, graphene, and the like to absorb or emit radiation at a selected frequency or wavelength. Exemplary carbon nanotube element 219 includes vertically aligned carbon nanotubes 212. Moreover, carbon nanotube element 219 can be modified by plasma exposure, exposure to liquids or gases, mechanically modified, or coated by an element or chemical. A longitudinal length (e.g., a height from base 214 toward an outer surface of substrate 210) of carbon nanotube element 219 can have a thickness that is less than the substrate thickness. In an embodiment, carbon nanotube element 219 includes vertically aligned carbon nanotubes 212.

Radiation absorber 220 includes a carbon nanotube element 219. It is contemplated that radiation absorber 220 also can include vertically aligned carbon nanotubes 212, carbon nanoribbons, carbon nanowalls, graphite nanocones, graphene, spray-on carbon nanotubes, nanowires, black paint, and the like. Moreover, the radiation absorber 220 can include a plurality of high aspect ratio structures with small cross-sectional area facing incident light (e.g., from 1 nm to 1000 nm) and long length parallel to incident light (from 1 µm to 1 m).

Well 216 can include ambient gas in an absence of well cover 238 or gas at a selected pressure in a presence of well cover 238. Inert gases such as Ar, N$_2$, He, or Kr can be used to adjust the thermal conductivity within well 216. Gas pressure may be adjusted to provide a selected thermal conductivity with the lowest thermal conductivities achieved at pressures less than 10$^{-3}$ Torr. A first length L1 (e.g., a height from base 214 to an outer surface of substrate 210) of well 216 can be from 1 µm to 10 cm, specifically from 100 µm to 10 mm, and more specifically from 10 µm to 1000 µm. A second length L2 (e.g., a width across base 214) of well 216 can be from 100 nm to 100 cm, specifically from 1 µm to 1 cm, and more specifically from 10 µm to 1000 µm. In an embodiment, well 216 can be formed in a silicon substrate 210 by using deep reactive ion etching process (e.g. Bosch process).

Stimulant radiation 222 is received by radiation absorber 220. Stimulant radiation 222 can include radiation such as ultraviolet light, visible light, and infrared light, used to heat radiation absorber 220 that can include carbon nanotube element 219. A temporal pulse width of stimulant radiation 222 can be from 1 ps to 10 hours, specifically from 1 ns to 1 s, and more specifically from 1 µs to 100 ms. A wavelength of stimulant radiation 222 can be from 1 nm to 10 mm, specifically from 10 nm to 1 mm, and more specifically from 100 nm to 100 µm. In an embodiment, stimulant radiation 222 includes ultraviolet to far infrared light used to heat radiation absorber 220 for bolometry.

Absorber heat 230 is produced by conversion of radiation to thermal heat using radiation absorber 220 that includes carbon nanotube element 219 including vertically aligned carbon nanotubes 212 in response to receipt of stimulant radiation 222. Absorber heat 230 can include thermal heat to raise the temperature of the base 214. Moreover, absorber heat 230 is sufficient to raise the temperature of base 214 to be readout by the thermistor.

Heater 226 produces electrical substitution heat 232 for calibration of thermistor 228. Heater 226 can include metallic thin film wiring such as gold, copper, tungsten, or nichrome traces to heat base 214 by passing a current through the traces to provide ohmic heating. Exemplary heaters 226 include nichrome thin film traces. In an embodiment, heater 226 includes a nichrome meander to distribute the heat evenly on base 214.

To produce electrical substitution heat 232, heater 226 receives electrical substitution current 234. Electrical substitution current 234 can include a current source or a voltage source to provide sufficient power to provide ohmic heating.

Thermistor 228 can include a semiconductor (e.g., metal oxide) which has a negative temperature coefficient such as vanadium oxide, manganese cobalt nickel, zirconium oxynitride, or a metal which has a positive temperature coefficient such as titanium, platinum, or molybdenum to change resistance in accordance to a temperature rise associated with stimulant radiation 222 or electrical substitution heat 232. Exemplary thermistors 228 include vanadium oxide. Moreover, thin film vanadium oxide has a large negative temperature coefficient of resistance (e.g., having an absolute value greater than 1%/° C.). In an embodiment, thermistor 228 includes thin film vanadium oxide with a negative temperature coefficient of resistance whose absolute value is greater than 1%/° C. Thermistor 228 produces thermistor signal 248 from absorber heat 230 or electrical substitution heat 232. Thermistor signal 248 can include a change in resistance which is readout as a change in voltage or current depending upon the bias circuit.

Figure 9:
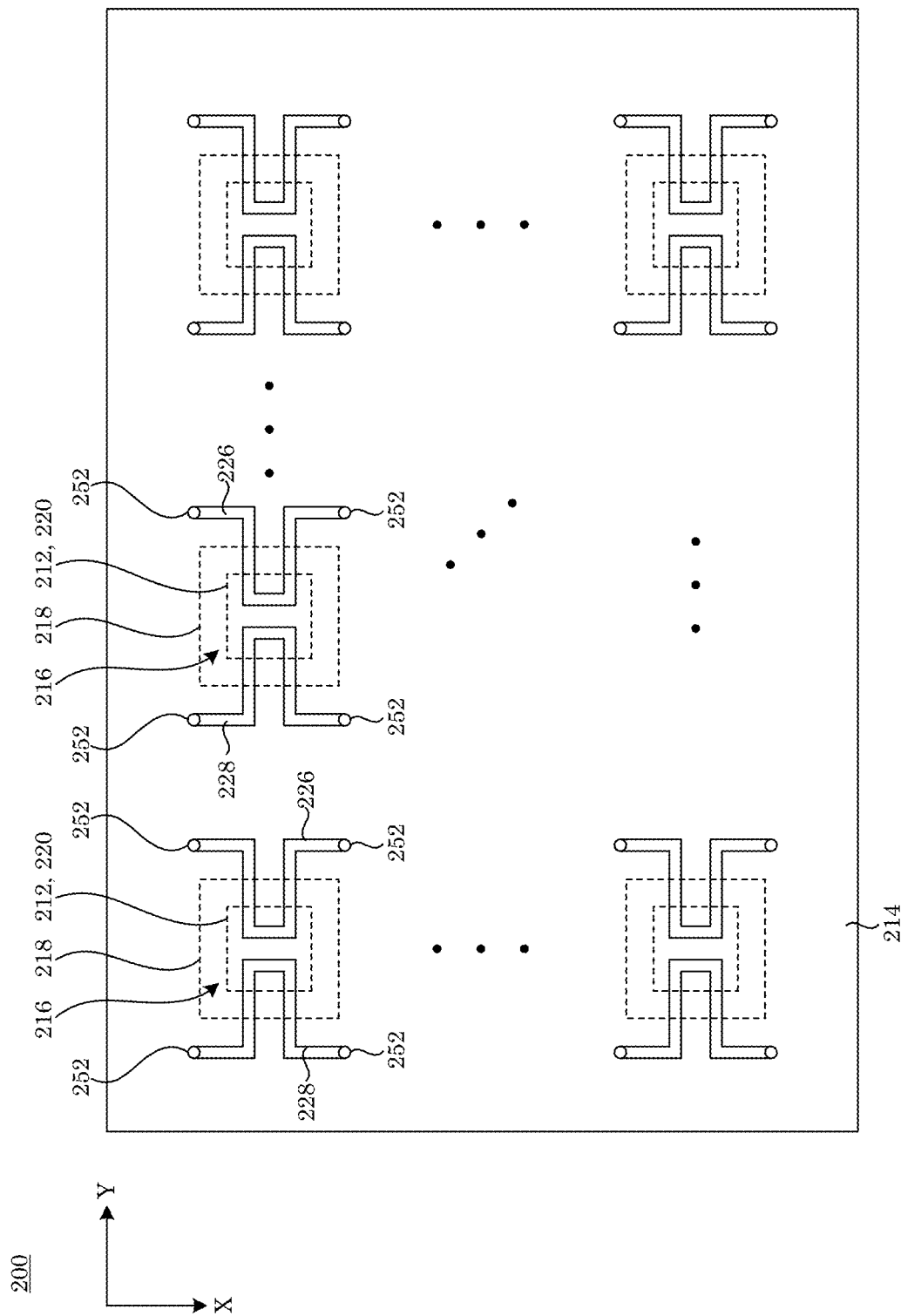
FIG. 9 shows a bottom view of the recessed carbon nanotube bolometer shown in FIG. 7.

Electrical substitution member 236 includes heater 226 and thermistor 228, and readout member 240 can include an array of readout circuits 242 as shown in FIG. 11. Readout circuits match the layout of the pixel array, e.g., as shown in FIG. 9. It is contemplated that each electrical substitution member 236 is individually addressable via a corresponding readout circuit 242.

Heater circuit 244 can include a voltage or current source to provide electrical substitution current 234 to the heater 226. In an embodiment, heater circuit 244 includes a low noise adjustable current source.

Thermistor circuit 246 can include a circuit to measure the change in impedance of the thermistor 228 due to a change in temperature. In an embodiment, thermistor circuit 246 includes a low noise AC bridge readout.

Thermistor circuit 246 and heater circuit 244 independently can be interfaced and in electrical communication with a processor, controller, power supply, and the like to control, provide power, or receive data from thermistor circuit 246 or heater circuit 244.

Bump bond member 252 provides electrical conductivity between the thermistor circuit 246 and the thermistor 228 and between the heater circuit 244 and the heater 226. Bump bond member 252 can include metallic traces to readout circuitry on-wafer, wire bonds to a separate chip or wafer, or a deformable metal that makes electrical contact to another deformable metal (on another chip or wafer) after application of pressure or heat to electrically interface the recessed carbon nanotube bolometers to a readout member 240 which may be another chip or wafer with additional electronics and can be a readout integrated circuit (ROIC) wafer. Exemplary bump bond members 252 include indium, gold, and eutectic metal alloys. Moreover, the bump bond members can be 1-100 µm in diameter and 1-100 µm tall on a 2 µm-200 µm pitch. In an embodiment, bump bond member 252 includes evaporated or electroplated indium pads 20 µm in diameter on a 30 µm pitch.

Temporary cover 254 can be placed over the recessed carbon nanotube wells that is removable without damaging the carbon nanotubes to protect the recessed carbon nanostructure from subsequent processing steps that will involve liquids, solvents, or plasma and can be an electrostatically bonded wafer, polymer film (e.g., polyimide tape such as KAPTON tape), or a wafer attached by epoxy. Exemplary temporary covers 254 include an electrostatically bonded wafer. Moreover, the electrostatically bonded wafer is impervious to liquids, solvents, acids, plasma etching while maintaining protection of the recessed carbon nanotube structure. In an embodiment, temporary cover 254 includes a polyimide coated wafer that can be electrostatically bonded using a high voltage charging station.

Well cover 238 can include a rigid or flexible layer that hermetically seals well 216 with optional gas. Well cover 238 protects carbon nanotube element 219 and can be another wafer or polymer film. Exemplary well covers 238 include silicon, quartz, diamond, sapphire, and germanium. Moreover, the well cover can also selectively filter incoming stimulant radiation. In an embodiment, well cover 238 may include a quartz wafer to admit visible light (400 nm to 700 nm), a silicon wafer to admit near infrared (greater than 700 nm), or diamond to admit broadband radiation out to the far infrared (0.2 µm to 100 µm).

Figure 5:
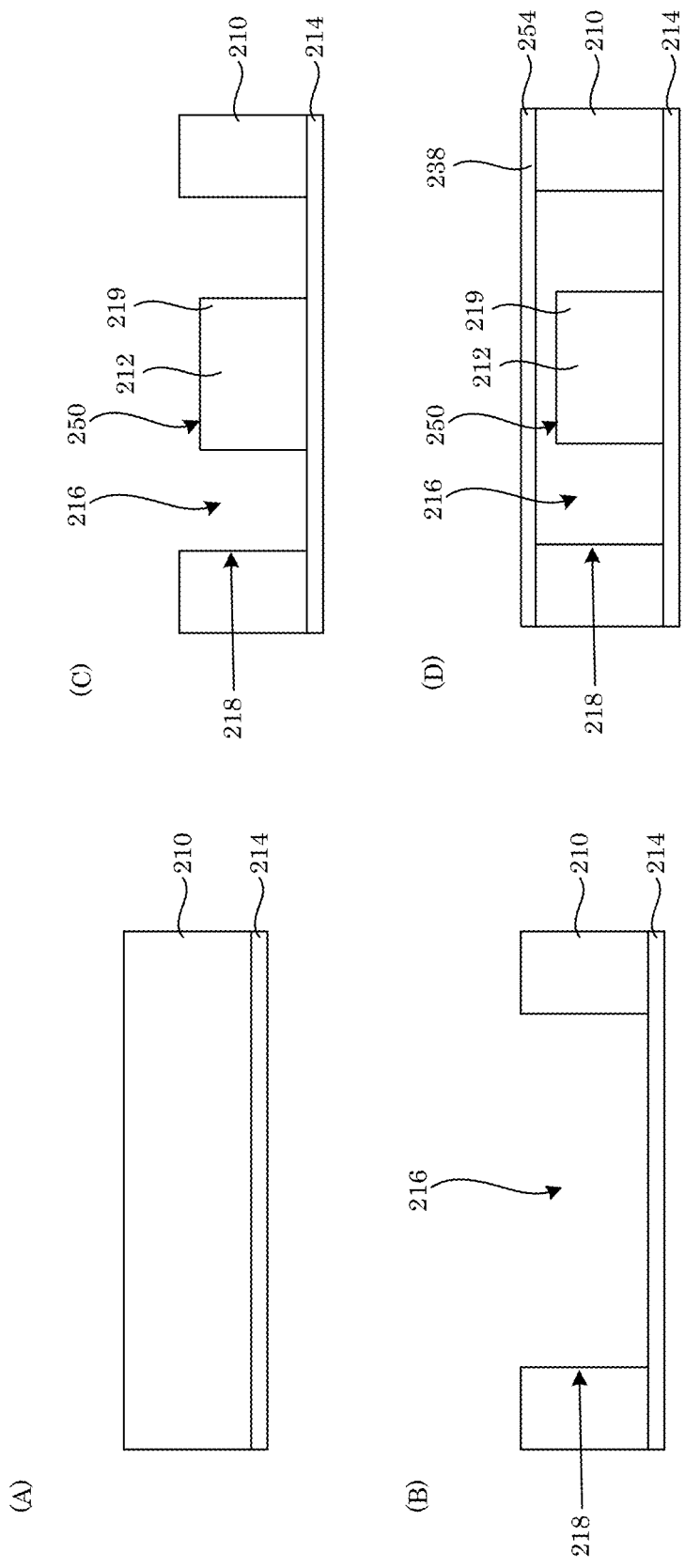
FIG. 5 shows cross-sections of a process for making a recessed carbon nanotube article.
Figure 6:
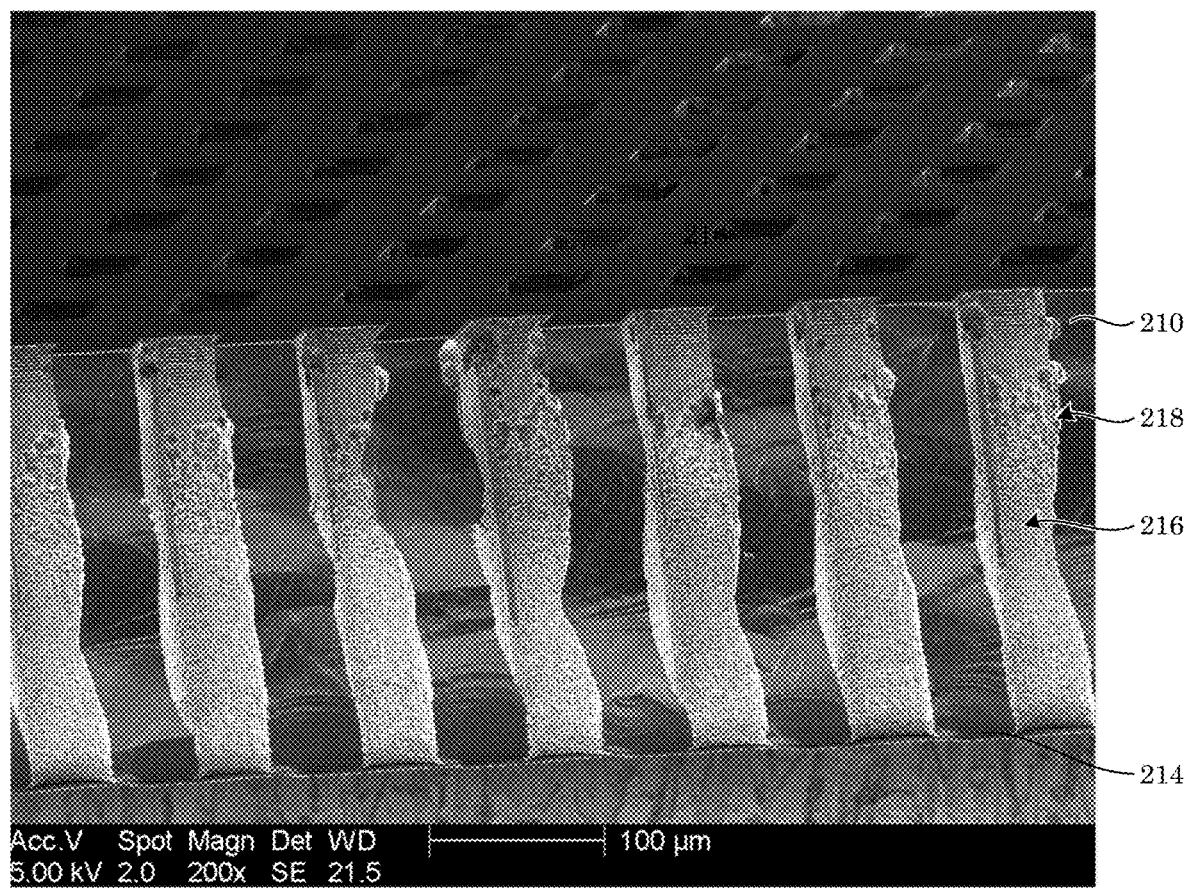
FIG. 6 shows an SEM image of a section of a well formed in a substrate on a base.
Figure 7:
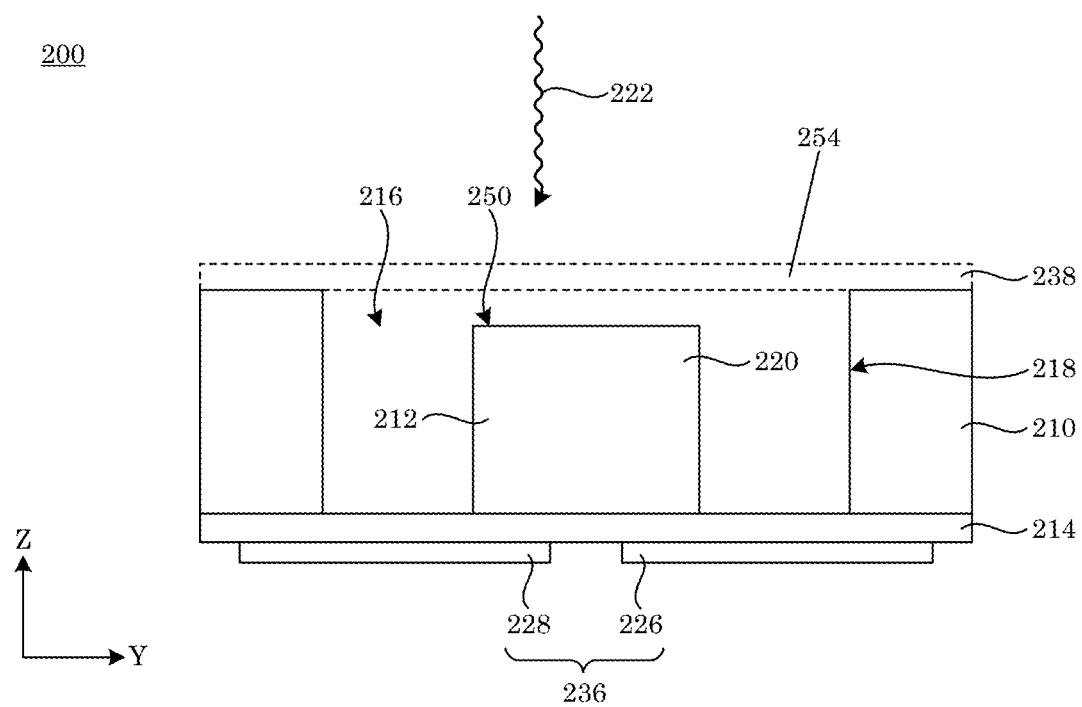
FIG. 7 shows a cross-section diagram of a recessed carbon nanotube bolometer.

Recessed carbon nanotube article 100 can be made in various ways. In an embodiment, a process for making recessed carbon nanotube article 100 includes: forming substrate 210 on base 214 (FIG. 5, panel A); forming well 216 in substrate 210 (FIG. 5, panel B; FIG. 6); forming vertically aligned carbon nanotubes 212 in well 216 (FIG. 5, panel C); terminating formation of vertically aligned carbon nanotubes 212 in well 216 prior to terminus 250 of vertically aligned carbon nanotubes 212 penetrating beyond well 216 (FIG. 3); disposing well cover 238 on substrate 210 to cover vertically aligned carbon nanotubes 212 and well 216 in an absence of contact between vertically aligned carbon nanotubes 212 and well cover 238 (FIG. 5, panel D).

In the process for making recessed carbon nanotube article 100, forming substrate 210 on base 214 includes using a single material for both the substrate 210 and base 214 like a silicon wafer. The base 214 can also be a different material from the substrate 210, and can be formed by chemical vapor deposition (i.e. silicon nitride or silicon oxide) or electrostatically bonding a wafer (base 214) onto the substrate 210.

In the process for making recessed carbon nanotube article 100, forming well 216 in substrate 210 includes mechanical subtractive methods (e.g., milling, drilling, water jet, and the like), wet chemical etching (with, e.g., KOH, TMAH, and the like), reactive ion etching (with, e.g., $XeF_2$, $SF_6$, and the like), and deep reactive ion etching (e.g. Bosch process).

In the process for making recessed carbon nanotube article 100, forming well 216 in substrate 210 can include lithographically defining the well 216 by photolithography or electron-beam lithography; deep reactive ion etching of well 216 into substrate 210 by a gas specific chemistry to enable selective etching of the substrate; and terminating the deep reactive ion etching at base 214 by timing or using an etch stop such as silicon oxide, which is not etched by the specific chemistry and process used to deep reactive ion etch the substrate.

In the process for making recessed carbon nanotube article 100, forming carbon nanotube element 219 consisting of vertically aligned carbon nanotubes 212 in well 216 includes deposition of a support catalyst and then a catalyst on the base 214 of each well 216. The support catalyst can include a metal oxide (e.g., aluminum oxide) or a metal nitride (e.g., aluminum nitride, titanium nitride). The catalyst can include a transition metal such as Fe, Co, or Ni. The support catalyst is disposed first, and the catalyst is disposed subsequently. Each catalyst layer can be disposed using physical vapor deposition (e.g., sputtering, e-beam evaporation, and the like) or electrodeposition. Vertically aligned carbon nanotubes 212 can be grown by chemical vapor deposition at a temperature of base 214 and substrate 210 from 400° C. to 1200° C. from a carbon feedstock gas such as methane, ethane, acetylene, and the like.

In the process for making recessed carbon nanotube article 100, terminating formation of vertically aligned carbon nanotubes 212 in well 216 includes selecting a growth rate (μm/min) of the VACNT growth rate that can be determined, e.g., on a test substrate that includes the same base 214, support catalyst, and catalyst. A timed growth in accordance with the selected growth rate is used to terminate growth of vertically aligned carbon nanotubes 212 so that a terminus thereof is below well cover 238 on recessed carbon nanotube article 100.

In the process for making recessed carbon nanotube article 100, disposing well cover 238 on substrate 210 includes electrostatically bonding a polyimide coated wafer using high voltage charging equipment.

The process for making recessed carbon nanotube article 100 further can include removing well cover 238 from substrate 210 to expose vertically aligned carbon nanotubes 212 in well 216 by using a high voltage charging station to electrostatically de-bond (i.e., discharge) a polyimide coated wafer to substrate 210.

The process for making recessed carbon nanotube article 100 further can include disposing well cover 238 on substrate 210 to cover vertically aligned carbon nanotubes 212 and well 216 in an absence of contact between vertically aligned carbon nanotubes 212 and well cover 238 by preparing the mating surfaces of the well cover and the substrate using plasma cleaning and activation of the two surfaces. The well cover and substrate can be pressed together and heated to promote bonding of the two mating surfaces. Additionally, the well cover and substrate may be glued to further enhance the bonding process.

The process for making recessed carbon nanotube article 100 further can include hermetically sealing well cover 238 to substrate 210 to hermetically seal well 216 by preparing the mating surfaces of the well cover and the substrate using plasma cleaning and activation of the two surfaces. The well cover and substrate can be pressed together and can be heated in an environmental chamber at a vacuum pressure of less than or equal to $10^{-7}$ Torr or at a gas partial pressure up to 1000 Torr of a selected gas; thereby, entrapping the gas upon mating of the well cover and substrate. Additionally, the well cover and substrate may be glued to further enhance hermiticity and the bonding process.

In the process for making recessed carbon nanotube article 100, hermetically sealing well cover 238 to substrate 210 can include wafer bonding well cover 238 to substrate 210 by direct wafer-to-wafer bonding, fusion bonding, adhesive bonding, anodic bonding, and the like.

In the process for making recessed carbon nanotube article 100, hermetically sealing well cover 238 can include introducing a gas in well 216 by applying the well cover in a chamber containing a gas or vacuum less than $10^{-3}$ Torr; and sealing the gas in well 216 upon hermetically sealing well cover 238 by direct wafer-to-wafer bonding. It is contemplated that the gas can includes Ar, $N_2$, He, or the like. Such gas can be used to adjust the thermal conductance.

In an embodiment, the base, substrate, and cover are silicon, which are processed according to silicon wafer processing. Thus prepared, such base, substrate, and cover provide recessed carbon nanotube article 100 with an enhanced thermalization with the environment that provides for heatsinking due to radiation. The silicon cover can be left on or removed from carbon nanotube article 100 as an additional process step. If the cover is removed, the vertically aligned carbon nanotubes can provide direct contact heatsinks. In an embodiment, the substrate is silicon, and the base is a low thermal conductivity material such as silicon nitride. Further fabrication of elements on the base can provide a structure to readout a detector array or control an emitter array.

Recessed carbon nanotube article 100 and processes disclosed herein have numerous beneficial uses including the ability to subsequently process the recessed carbon nanotube article 100 without damaging the carbon nanotube elements 219 or having to perform high temperature processing (i.e., growth of carbon nanotubes). Advantageously, recessed carbon nanotube article 100 overcomes limitations of technical deficiencies of conventional articles that involve limited materials for radiation absorption and manufacturing limitations.

Moreover, recessed carbon nanotube article 100 includes vertically aligned carbon nanotubes 212 disposed in a protective well, wherein recessed carbon nanotube article 100 can be made with processing that is destructive to VACNTs but can be performed without deleteriously affecting vertically aligned carbon nanotubes 212 due to a presence of well cover 238. Accordingly, recessed carbon nanotube article 100 overcomes a structurally delicate nature of vertically aligned carbon nanotubes that are not amenable to conventional processing techniques such as photolithography, wet etching, solvent cleaning, and the like that involve physical contact that could destroy a high aspect ratio of vertically aligned carbon nanotubes. In an absence of well cover 238, destruction of vertically aligned carbon nanotubes 212 could occur by surface tension clumping (with solvents), deformation (by physical contact), or removal (e.g., removal of photoresist adhered to VACNTs). It should be appreciated that chemical vapor deposition (CVD) growth of the VACNTs occurs at a high temperature, e.g., 400° C. to 1000° C., but high temperature growth can damage certain structures formed on a wafer. Damage can include, e.g. melting of metal traces, alloying, crystallization of layers, diffusion of dopants, and the like that cause conventional processing via microelectronic fabrication and VACNT growth to be incompatible, resulting in lack of incorporation of VACNTs in conventional devices. Recessed carbon nanotube article 100 and processes herein overcome this technical problem and provide VACNT integration in microelectronic devices so subsequent processing after formation of vertically aligned carbon nanotubes 212 is possible.

In the process for making recessed carbon nanotube bolometer 200, forming thermistor 228 on base 214 includes defining, by photolithography, a mask of selected trace dimensions and forming, by physical vapor deposition or electrodeposition, the thermistor material.

In the process for making recessed carbon nanotube bolometer 200, forming heater 226 proximate to thermistor 228 and on base 214 includes defining, by photolithography, a mask of selected trace dimensions and forming, by physical vapor deposition or electrodeposition, the heater material.

The process for making recessed carbon nanotube bolometer 200, forming bump bond member 252 on base 214 proximate to electrical substitution member 236 includes defining, by photolithography, a mask of selected trace dimensions and forming, by physical vapor deposition or electrodeposition, the bump bond member material by physical vapor deposition or electrodeposition.

The process for making recessed carbon nanotube bolometer 200 further can include removing temporary cover 254 from substrate 210 to expose recessed carbon nanotube element 219 in well 216 by using a high voltage charging station to electrostatically de-bond a well cover 238 from substrate 210.

The process for making recessed carbon nanotube bolometer 200 further can include disposing readout member 240 on electrical substitution member 236 so that heater 226 is in electrical communication with readout circuit 242 and thermistor circuit 246 is in electrical communication with thermistor circuit 246 by flip chip bump bonding a readout circuit (ROTC). In this manner, readout circuit 242 and thermistor circuit 246 are part of readout circuit 242 of readout member 240.

In the process for making recessed carbon nanotube bolometer 200, forming well 216 in substrate 210 can include lithographically defining the well 216 by photolithography and performing deep reactive ion etching of well 216 into substrate 210 using a Bosch process plasma etch; and terminating the deep reactive ion etching at base 214 by timing or etch stop material. As used herein, the Bosch process can include an alternating two-step etch cycle process wherein an etch passivation layer is deposited using $C_4F_8$ for a time $t_1$ and a subsequent isotropic plasma etch using $SF_6$ is performed for a time $t_2$. Process parameters for the Bosch process include parallel plate RF power, inductively coupled RF coil power, RF frequency, substrate temperature, chamber pressure, gas flows and the like.

In the process for making recessed carbon nanotube bolometer 200, forming vertically aligned carbon nanotubes 212 in the well 216 can include disposing a catalyst support layer and catalyst on base 214 in well 216 by electron beam deposition; and performing chemical vapor deposition to deposit vertically aligned carbon nanotubes 212. Chemical vapor deposition can occur at a temperature of the base 214 and the substrate 210 from 400° C. to 1000° C. from a carbon feedstock gas such as methane, ethane, acetylene, and the like.

Figure 14:
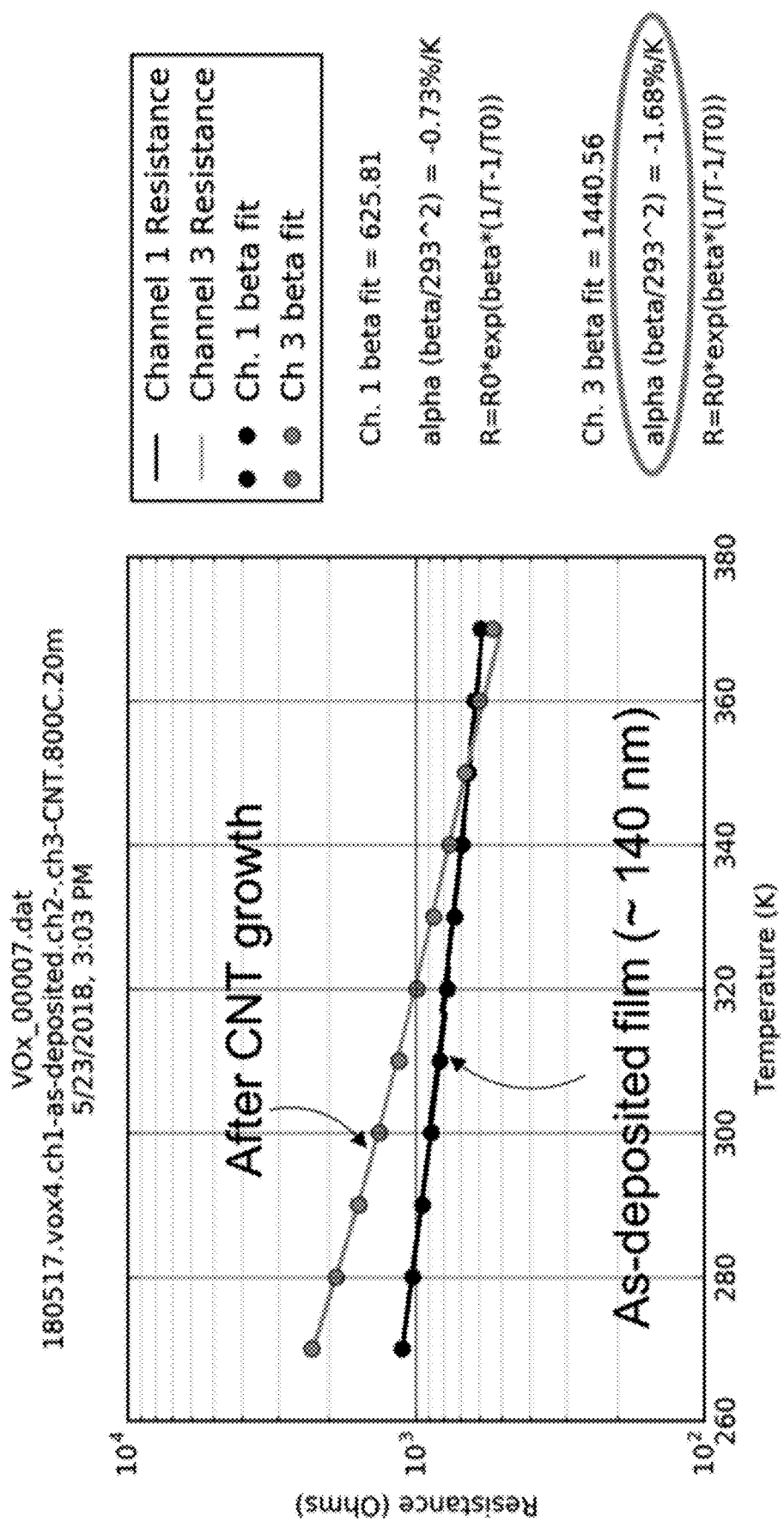
FIG. 14 shows a graph of resistance versus temperature for a film of vanadium oxide before and after formation of vertically aligned carbon nanotubes. The film was reactively sputtered from a vanadium target using a DC power supply and deposited onto a substrate at an elevated temperature of 500° C.
Figure 15:
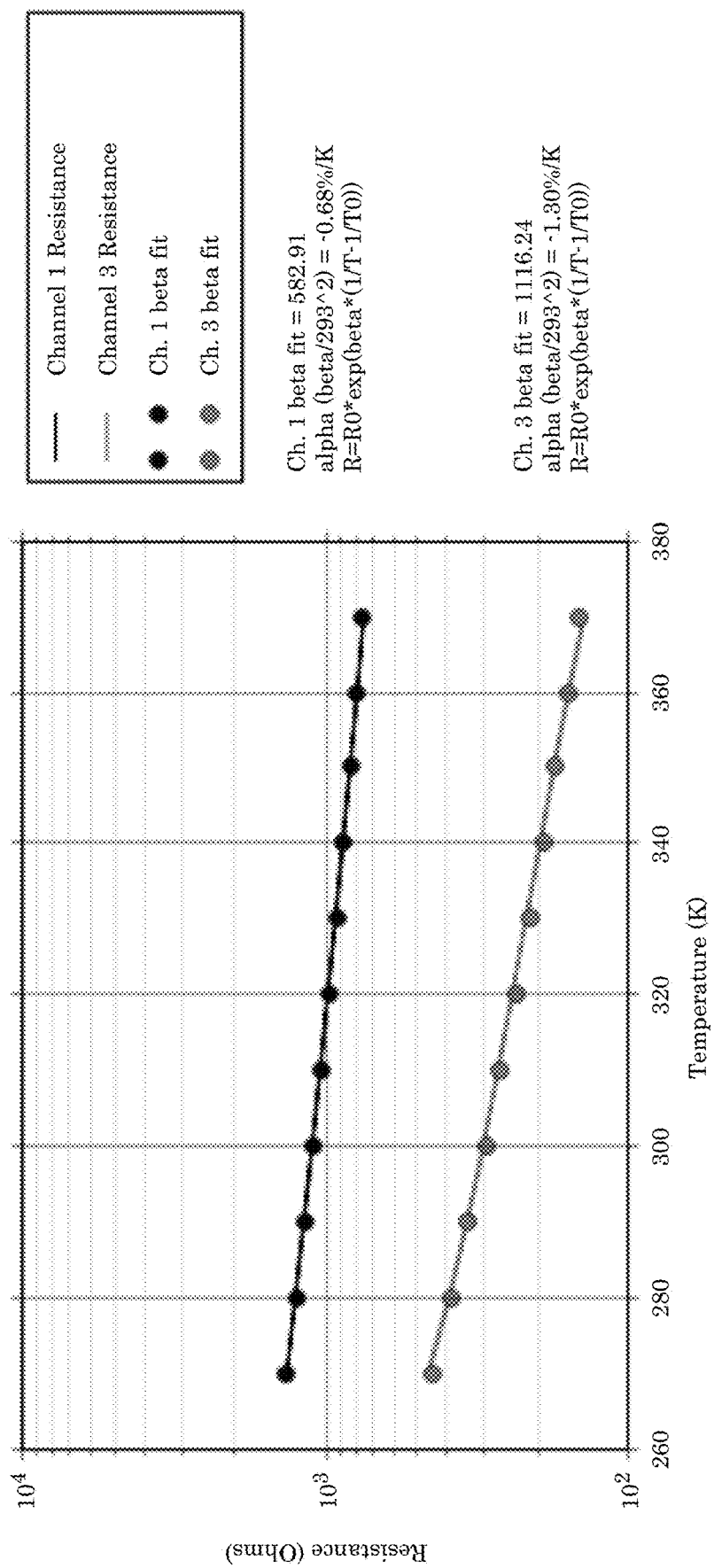
FIG. 15 shows a graph of resistance versus temperature for a film of vanadium oxide before and after formation of vertically aligned carbon nanotubes. The film was reactively sputtered from a vanadium target using a DC power supply in combination with an RF power supply and deposited onto a substrate at room temperature.
Figure 16:
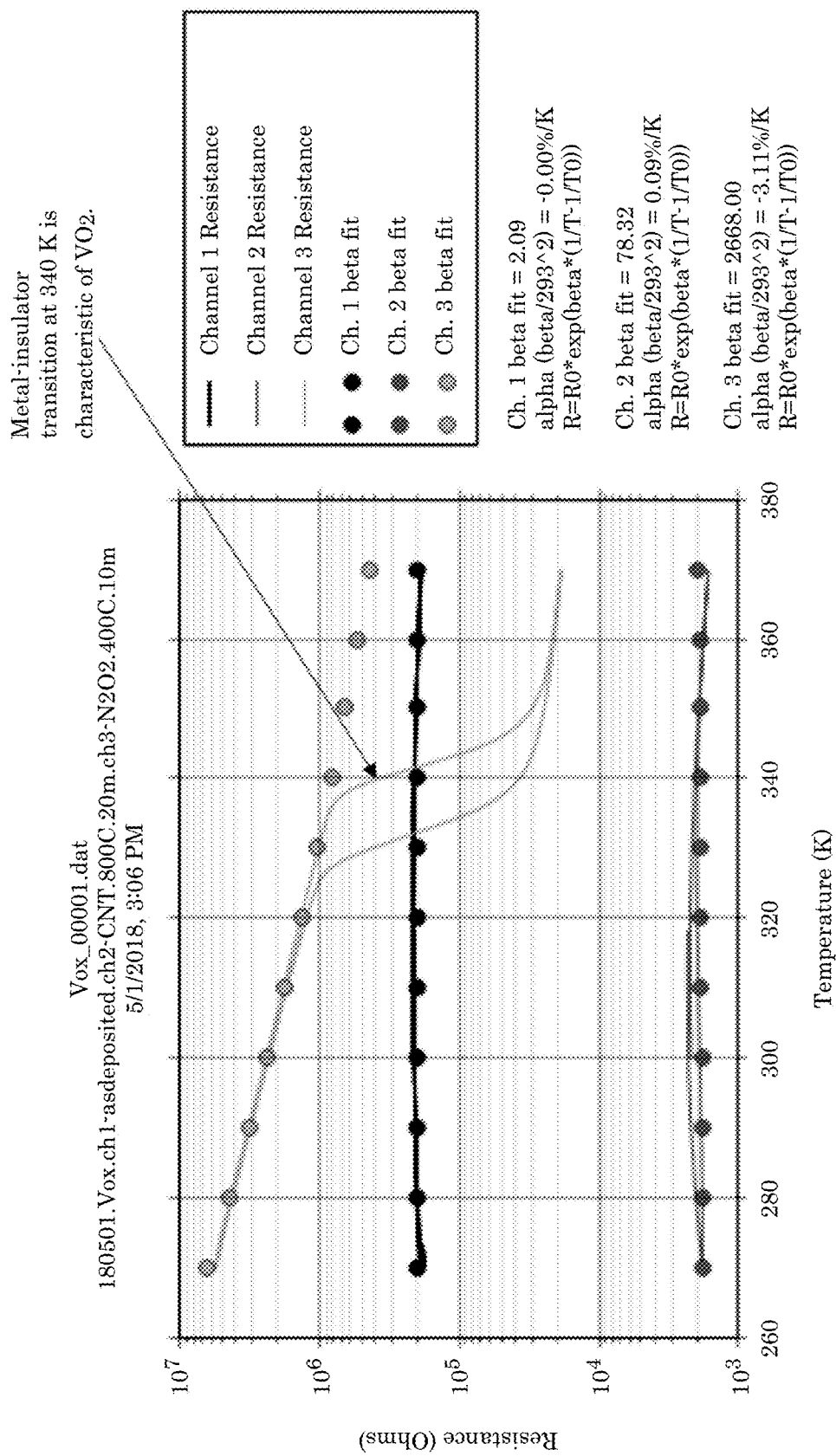
FIG. 16 shows a graph of resistance versus temperature for films of vanadium oxide as-deposited, after a rapid thermal anneal to 400° C. in $N_2O_2$ gas, and after formation of vertically aligned carbon nanotubes. The films were reactively sputtered from a vanadium target using a DC power supply and deposited onto a substrate at room temperature (21° C.)

In the process for making recessed carbon nanotube bolometer 200, forming thermistor 228 on base 214 can include lithographically defining thermistor 228; sputter depositing vanadium oxide on base 214 while base 214 is at a temperature that is from 20° C. to 700° C. or with a RF bias on the base 214 with a power from 0.1 W to 1000 W, to form a mixed phase vanadium oxide thin film on base 214 and annealing the vanadium oxide film on base 214 by application of heat from 20° C. to 500° C. in an atmosphere of $O_2$, Ar, $NO_x$, or the like. Here, thermistor 228 can have an absolute value of the temperature coefficient of resistance that is 0.1%/° C. or greater, specifically from 0.5%/° C. to 10%/° C., and more specifically from 1%/° C. to 5%/° C. Here, with reference to FIG. 14, the vanadium oxide film was reactively sputtered from a vanadium target using a DC power supply and deposited onto a substrate at an elevated temperature of 500° C. Here, with reference to FIG. 15, the vanadium oxide film was reactively sputtered from a vanadium target using a DC power supply in combination with an RF power supply (13.56 MHz) and deposited onto a substrate at room temperature (21° C.). Here, with reference to FIG. 16, the vanadium oxide films were reactively sputtered from a vanadium target using a DC power supply and deposited onto a substrate at room temperature (21° C.).

In the process for making recessed carbon nanotube bolometer 200, forming heater 226 on base 214 can include defining heater 226 by photolithography, e-beam lithography, or the like; and depositing a thin film comprising metal on base 214 to form heater 226 by lift-off deposition of a physical vapor deposited metal.

In the process for making recessed carbon nanotube bolometer 200, forming bump bond member 252 on base 214 can include lithographically defining bump bond member 252 on base 214 by photolithography, e-beam lithography, or the like; and depositing an electrically conductive member as bump bond member 252 by physical vapor deposition, electrodeposition, or the like.

In the process for making recessed carbon nanotube bolometer 200, hermetically sealing well cover 238 to substrate 210 can include wafer bonding well cover 238 to substrate 210 by direct bonding, gluing, laminating, and the like.

In the process for making recessed carbon nanotube bolometer 200, hermetically sealing well cover 238 can include introducing a gas in well 216 by applying the well cover in a chamber containing a gas or vacuum less than $10^{-3}$ Torr; and sealing the gas in well 216 upon hermetically sealing well cover 238 by direct wafer-to-wafer bonding. It is contemplated that the gas can includes Ar, $N_2$, He, or the like. Such gas can be used to adjust the thermal conductance; and sealing the gas in well 216 upon hermetically sealing well cover 238 by direct bonding, gluing, laminating, and the like.

Recessed carbon nanotube bolometer 200 has numerous advantageous and unexpected benefits and uses. Detection is based on a temperature measurement of thermistor 228 in thermal communication with base 214 as a thermal mass. Radiation absorber on base 214 converts incident optical power from stimulant radiation 222 into a temperature variation. Heater 226 in combination with thermistor 228 provides calibration of recessed carbon nanotube bolometer 200 by electrical substitution (ES). Here, electrical substitution links optical power measurements to the watt by comparing a temperature rise induced in a radiation absorber 220 consisting of carbon nanotube element 219 consisting of vertically aligned carbon nanotubes 212 by incident stimulant radiation 222 to that induced by electrical heating. It is contemplated that recessed carbon nanotube bolometer 200 can be operated in a closed-loop mode.

In an embodiment, with reference to FIG. 13, a process for performing bolometry with recessed carbon nanotube bolometer 200 includes receiving stimulant radiation 222 by vertically aligned carbon nanotubes 212 of radiation absorber 220; producing absorber heat 230, by vertically aligned carbon nanotubes 212, from stimulant radiation 222; receiving, by thermistor 228, absorber heat 230 from vertically aligned carbon nanotubes 212; producing, by thermistor 228, thermistor signal 248; and receiving, by thermistor circuit 246, thermistor signal 248. Thermistor signal 248 can be communicated from thermistor circuit 246 or thermistor 228, e.g., to a processor, for data acquisition and analysis. Here, the change in thermistor signal is associated with stimulant radiation, or more specifically radiant exitance (radiant flux $W/m^2$), which produces absorber heat 230, of a scene or an object for thermographic imaging. The process for performing bolometry with the recessed carbon nanotube bolometer 200 also can include measuring the stimulant radiation 222, or resulting absorber heat 230, of a scene using a pixelated array of carbon nanotube microbolometers 200, obscuring the pixelated array from the stimulant radiation 222 using a shutter and applying electrical substitution heat 232 equivalent to the absorber heat 230. The applied electrical substitution heat 232 is a direct measurement of the radiant exitance of the scene.

According to an embodiment, a process for performing electrical substitution with recessed carbon nanotube bolometer 200 includes: producing electrical substitution current 234 by heater circuit 244; receiving, by heater 226, electrical substitution current 234 from heater circuit 244; producing, by heater 226, electrical substitution heat 232 from electrical substitution current 234; receiving, by thermistor 228, electrical substitution heat 232 from heater 226; and producing, by thermistor 228, thermistor signal 248 from electrical substitution heat 232. The process also can include receiving, by thermistor circuit 246, thermistor signal 248 from thermistor 228. Thermistor signal 248 can be communicated from thermistor circuit 246 or thermistor 228, e.g., to a processor, for data acquisition and analysis. Here, a thermistor signal is associated with a change in absorber heat. The process for performing electrical substitution with the recessed carbon nanotube bolometer 200 also can include determining the electrical substitution heat 232 required for an equivalent amount of absorber heat 230 when the radiation absorber 220 is obscured from the desired stimulant radiation 222 (or radiant exitance) to be measured.

Figure 17:
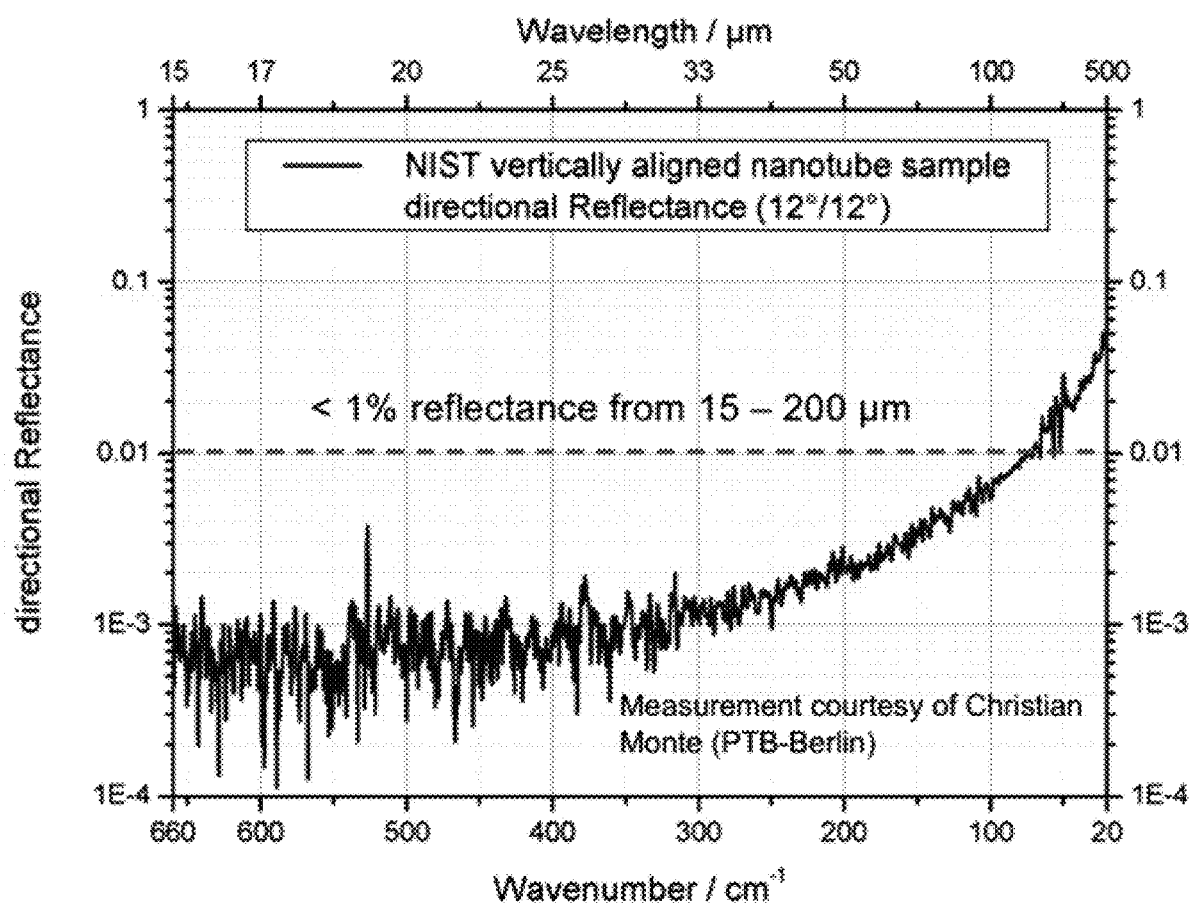
FIG. 17 shows a graph of the measured directional reflectance)(12°/12° versus wavelength of light incident on vertically aligned carbon nanotubes.

Recessed carbon nanotube bolometer 200 and processes disclosed herein have numerous beneficial uses, including far infrared bolometry, limited field of view bolometry, and satellite-based earth remote sensing bolometry. Advantageously, recessed carbon nanotube bolometer 200 overcomes limitations of technical deficiencies of conventional articles such as broadband absorption of radiation afforded by the used of vertically aligned carbon nanotubes 212 (FIG. 17). Conventional devices lack broadband capabilities (narrow band of approximately 10 µm) and low absorption (<50% at far infrared wavelengths).

Moreover, recessed carbon nanotube bolometer 200 includes vertically aligned carbon nanotubes 212 disposed in a microelectronic device, wherein making the device with processing that is normally destructive to VACNTs can be performed without deleteriously affecting vertically aligned carbon nanotubes 212 due to a presence of well cover 238 that forms a hermetic structure to enclose vertically aligned carbon nanotubes 212 after growth, aid in fabrication of recessed carbon nanotube bolometer 200, and form final packaging. Accordingly, recessed carbon nanotube bolometer 200 overcomes a structurally delicate nature of vertically aligned carbon nanotubes that are not amenable to conventional processing techniques such as photolithography, wet etching, solvent cleaning, and the like that involve physical contact that could destroy a high aspect ratio of vertically aligned carbon nanotubes. In an absence of well cover 238, destruction of vertically aligned carbon nanotubes 212 could occur by surface tension clumping (with solvents), deformation (by physical contact), or removal (e.g., removal of photoresist adhered to VACNTs). It should be appreciated that chemical vapor deposition (CVD) growth of the VACNTs occurs at a high temperature, e.g., 400° C. to 1000° C., but high temperature growth can damage certain structures formed on a wafer. Damage can include, e.g. melting of metal traces, alloying, crystallization of layers, diffusion of dopants, and the like that cause conventional processing via microelectronic fabrication and VACNT growth to be incompatible resulting in lack of incorporation of VACNTs in conventional devices. Recessed carbon nanotube bolometer 200 and processes herein overcome this technical problem and provide VACNT integration in microelectronic devices so subsequent processing after formation of vertically aligned carbon nanotubes 212 is possible. It is contemplated that recessed carbon nanotube bolometer 200 include an electrical substitution microbolometer array with vertically aligned carbon nanotubes 212 as a broadband, low reflectance (less than 1% reflectance from 5 µm to 50 µm) radiation absorber 220. Recessed carbon nanotube bolometer 200 thus is operable at shortwave infrared (SWIR, 1 µm to 3 µm), mid-wave infrared (MWIR, 3 µm to 8 µm), long-wave infrared (LWIR, 8 µm to 15 µm), and far infrared (FIR, 15 µm to 1000 µm) that overcomes conventional microbolometers spectral limitation to 8 µm to 15 µm. Moreover, disposing vertically aligned carbon nanotubes 212 in well 216 provides a field of view (FOV) for each pixel that is advantageous for a cooled microbolometers, wherein substrate wall 218 is at a lower temperature than a targeted scene.

Recessed carbon nanotube bolometer 200 also overcomes conventional handling of microbolometers that are calibrated before deployment or in-field using an external blackbody target. Drift of the instrument can occur after initial calibration and calibration with an external blackbody target in-field can increase complexity and SWaP (size, weight, and power) parameters of conventional microbolometer imaging devices. Air-borne or space-based deployment of microbolometer imaging can rely upon SWaP reductions. In particular, recessed carbon nanotube bolometer 200 includes electrical substitution at a pixel level for internal calibration, providing low SWaP, in-field calibrations. Advantageously, electrical substitution calibration includes each pixel with a heater that heats the absorbing element; wherein the heater determines an amount of electrical power (while the pixel is shuttered or obscured from optical power) is provided for an equivalent temperature rise caused by optical power of stimulant radiation 222.

Moreover, recessed carbon nanotube bolometer 200 and processes herein have numerous advantageous properties. In an aspect, the recessed carbon nanotube article 100 allows for limited field of view (FOV) of each carbon nanotube element 219, protection of individual carbon nanotube element 219 from physical contact, and individual optical filtering of each carbon nanotube element 219.

Recessed carbon nanotube bolometer 200 and processes herein unexpectedly provide integration of carbon nanotubes into CMOS devices which typically do not experience temperatures greater than 500° C. for back end of the line (BEOL) processes. By using a recessed carbon nanotube structure, high temperature CVD growth of the carbon nanotubes can be integrated with other high temperature front end of the line (FEOL) process such as oxide growth, doping, and the like. Additionally, if carbon nanotubes are grown at temperatures less than 500° C., it still allows for their integration with processes sensitive to even lower temperatures. The recessed carbon nanotubes can then be protected up to and BEOL processes. Moreover, recessed carbon nanotube bolometer 200 provides fabrication of bolometric detectors using materials and methods incompatible with carbon nanotube growth.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity). The conjunction "or" is used to link objects of a list or alternatives and is not disjunctive; rather the elements can be used separately or can be combined together under appropriate circumstances.

What is claimed is:

1. A recessed carbon nanotube article comprising:
    a base;
    a substrate disposed on the base;
    a plurality of wells disposed in the substrate and bounded by the base and a substrate wall; and
    a carbon nanotube element disposed in individual wells and that consists of a plurality of vertically aligned carbon nanotubes such that a longitudinal length of the vertically aligned carbon nanotubes is less than a depth of the well in which the carbon nanotube element is disposed.

2. The recessed carbon nanotube article of claim 1, further comprising a well cover disposed on the substrate opposing the carbon nanotube element and that, in combination with the base and the substrate wall, bounds the well in absence of contact with the vertically aligned carbon nanotubes.

3. A process for making a recessed carbon nanotube article, the process comprising:
    forming a substrate on a base;
    forming a well in the substrate, the well being bound by the base and a substrate wall;
    forming vertically aligned carbon nanotubes in the well;
    terminating formation of vertically aligned carbon nanotubes in the well prior to a terminus of the vertically aligned carbon nanotubes penetrating beyond the well; and
    disposing a well cover on the substrate to cover the vertically aligned carbon nanotubes and the well in an absence of contact between the vertically aligned carbon nanotubes and the well cover.

4. The process of claim 3, further comprising removing the well cover from the substrate to expose the vertically aligned carbon nanotubes in the well.

5. The process of claim 3, further comprising hermetically sealing the well cover to the substrate to hermetically seal the well.

6. The process of claim 5, wherein hermetically sealing the well cover to the substrate comprises wafer bonding the well cover to the substrate.

7. The process of claim 5, wherein hermetically sealing the well cover further comprises:
    introducing a gas in the well; and
    sealing the gas in the well upon hermetically sealing the well cover.

8. The process of claim 3, wherein forming the well in the substrate comprises:
    lithographically defining the well;
    deep reactive ion etching of the well into the substrate; and
    terminating the deep reactive ion etching at the base.

9. The process of claim 3, wherein forming vertically aligned carbon nanotubes in the well comprises:
    disposing a catalyst on the base in the well; and
    performing chemical vapor deposition to deposit the vertically aligned carbon nanotubes.

10. The process of claim 9, wherein chemical vapor deposition occurs at a temperature of the base and the substrate from 400° C. to 1000° C. with a carbon feedstock gas.

11. A recessed carbon nanotube bolometer comprising:
    a base;
    a substrate disposed on the base;
    a plurality of wells disposed in the substrate and bounded by the base and a substrate wall;
    a radiation absorber disposed in individual wells and that:
        consists of a plurality of vertically aligned carbon nanotubes such that a longitudinal length of vertically aligned carbon nanotubes is less than a depth of the well in which the radiation absorber is disposed;
        receives a stimulant radiation; and produces absorber heat from the stimulant radiation by the vertically aligned carbon nanotubes;
a plurality of thermistors disposed on the base such that a first thermistor:
is locally disposed and in thermal communication with a first radiation absorber in an absence of thermal communication with radiation absorbers that are adjacent to the first radiation absorber;
receives the absorber heat from the vertically aligned carbon nanotubes; and
produces a thermistor signal from the absorber heat; and
a plurality of heaters disposed on the base such that a first heater:
is locally disposed and in thermal communication with the first radiation absorber and disposed proximate to the first thermistor, in an absence of thermal communication with radiation absorbers that are adjacent to the first radiation absorber;
receives electrical substitution current;
produces, from the electrical substitution current, electrical substitution heat; and
communicates the electrical substitution heat to the first thermistor that is proximately disposed to the first heater,
wherein the thermistors and heaters are arranged as an electrical substitution member comprising an individual thermistor and an individual heater; and
a readout member disposed on the base such that the heaters and the thermistors are interposed between the readout member and the base.

12. The recessed carbon nanotube bolometer of claim 11, further comprising a well cover disposed on the substrate opposing the carbon nanotube element and that, in combination with the base and the substrate wall, bounds the well in absence of contact with the vertically aligned carbon nanotubes.

13. The recessed carbon nanotube bolometer of claim 11, wherein the readout member comprises a plurality of readout circuits such that an individual readout circuit is:
locally disposed on and in electrical communication with an individual electrical substitution member, so that each electrical substitution member is independently and individually electrically addressed by individual readout circuits,
wherein for each electrical substitution member the readout circuit in electrical communication with the electrical substitution member comprises a heater circuit in communication with the heater and a thermistor circuit in communication with the thermistor, the heater circuit providing the electrical substitution current to the heater, and the thermistor circuit receiving the thermistor signal from the thermistor.

14. A process for making a recessed carbon nanotube bolometer, the process comprising:
forming a substrate on a base;
forming a well in the substrate, the well being bound by the base and a substrate wall;
forming vertically aligned carbon nanotubes in the well;
terminating formation of vertically aligned carbon nanotubes in the well prior to a terminus of the vertically aligned carbon nanotubes penetrating beyond the well;
disposing a well cover on the substrate to cover the vertically aligned carbon nanotubes and the well in an absence of contact between the vertically aligned carbon nanotubes and the well cover;
forming a thermistor on the base opposite the well and the vertically aligned carbon nanotubes so that the thermistor is in thermal communication with the vertically aligned carbon nanotubes through the base; and
forming a heater proximate to the thermistor and on the base opposite the well and the vertically aligned carbon nanotubes to make the recessed carbon nanotube bolometer so that the heater is in thermal communication with the vertically aligned carbon nanotubes through the base, wherein the thermistor and the heater are arranged as an electrical substitution member on the base.

15. The process of claim 14, further comprising forming a bump bond member on the base proximate to the electrical substitution member.

16. The process of claim 15, further comprising disposing a readout member on the electrical substitution member so that the heater is in electrical communication with a readout circuit and the thermistor circuit is in electrical communication with a thermistor circuit, wherein the readout circuit and the thermistor circuit are part of a readout circuit of the readout member.

17. The process of claim 15, wherein forming the bump bond member on the base comprises:
lithographically defining the bump bond member on the base; and
depositing an electrically conductive member as the bump bond member.

18. The process of claim 14, further comprising removing the well cover from the substrate to expose the vertically aligned carbon nanotubes in the well.

19. The process of claim 14, further comprising hermetically sealing the well cover to the substrate to hermetically seal the well.

20. The process of claim 19, wherein hermetically sealing the well cover to the substrate comprises wafer bonding the well cover to the substrate.

21. The process of claim 19, wherein hermetically sealing the well cover further comprises:
introducing a gas in the well; and
sealing the gas in the well upon hermetically sealing the well cover.

22. The process of claim 14, wherein forming the well in the substrate comprises:
lithographically defining the well;
deep reactive ion etching of the well into the substrate; and
terminating the deep reactive ion etching at the base.

23. The process of claim 14, wherein forming vertically aligned carbon nanotubes in the well comprises:
disposing a catalyst on the base in the well; and
performing chemical vapor deposition to deposit the vertically aligned carbon nanotubes.

24. The process of claim 23, wherein chemical vapor deposition occurs at a temperature of the base and the substrate from 400° C. to 1000° C. from a carbon feedstock gas.

25. The process of claim 14, wherein forming the thermistor on the base comprises:
lithographically defining the thermistor;
sputter depositing vanadium oxide on the base to form a vanadium oxide film on the base; and
annealing the vanadium oxide film on the base,
wherein the thermistor has a temperature coefficient of resistance that is greater than or equal to $-1\%/°$ C.

26. The process of claim 14, wherein forming the heater on the base comprises:

lithographically defining the heater; and
depositing a thin film comprising metal on the base to form the heater.

* * * * *